(12) United States Patent
Kuypers et al.

(10) Patent No.: US 8,686,614 B2
(45) Date of Patent: Apr. 1, 2014

(54) MULTI-PORT MECHANICAL RESONATING DEVICES AND RELATED METHODS

(75) Inventors: Jan H. Kuypers, Cambridge, MA (US); Reimund Rebel, Maricopa, AZ (US); Alexei Gaidarzhy, Brighton, MA (US); David M. Chen, Brookline, MA (US); Guiti Zolfagharkhani, Brighton, MA (US); Klaus Juergen Schoepf, Chandler, AZ (US)

(73) Assignee: Sand 9, Inc., Cambridge, MA (US)

( * ) Notice: Subject to any disclaimer, the term of this patent is extended or adjusted under 35 U.S.C. 154(b) by 172 days.

(21) Appl. No.: 12/639,260

(22) Filed: Dec. 16, 2009

(65) Prior Publication Data

US 2010/0181868 A1   Jul. 22, 2010

Related U.S. Application Data

(60) Provisional application No. 61/138,171, filed on Dec. 17, 2008, provisional application No. 61/149,815, filed on Feb. 4, 2009, provisional application No. 61/172,003, filed on Apr. 23, 2009, provisional application No. 61/184,138, filed on Jun. 4, 2009.

(51) Int. Cl.
   *H01L 41/08* (2006.01)
(52) U.S. Cl.
   USPC .................. 310/313 R; 310/313 B; 310/346
(58) Field of Classification Search
   USPC ............................................. 310/321, 313 R
   See application file for complete search history.

(56) References Cited

U.S. PATENT DOCUMENTS

| | | | | |
|---|---|---|---|---|
| 3,916,348 | A | * | 10/1975 | Toda et al. ............... 333/155 |
| 4,384,409 | A | * | 5/1983 | Lao ........................... 33/318 |
| 4,454,440 | A | * | 6/1984 | Cullen .................... 310/313 R |
| 4,647,881 | A | * | 3/1987 | Mitsutsuka ............... 333/194 |
| 5,129,262 | A | * | 7/1992 | White et al. ............... 73/599 |
| 5,416,447 | A | | 5/1995 | Andres et al. |
| 5,914,553 | A | | 6/1999 | Adams et al. |
| 5,939,956 | A | | 8/1999 | Arimura et al. |
| 6,124,765 | A | | 9/2000 | Chan et al. |
| 6,150,748 | A | * | 11/2000 | Fukiharu ................ 310/313 R |
| 6,420,816 | B2 | * | 7/2002 | Getman et al. ......... 310/313 R |

(Continued)

FOREIGN PATENT DOCUMENTS

| | | | |
|---|---|---|---|
| EP | 0375360 | A2 | 6/1990 |
| EP | 1505722 | A2 | 2/2005 |

(Continued)

OTHER PUBLICATIONS

Driscoll, M.M., "Linear Frequency Tuning of Saw Resonators," *IEEE Trans. On Ultrasonics, Ferroelectrics and Frequency Control*:38(4):366-369 (1991).

(Continued)

*Primary Examiner* — Derek Rosenau
(74) *Attorney, Agent, or Firm* — Wolf, Greenfield & Sacks, P.C.

(57) ABSTRACT

Multi-port devices having multiple electrical ports are described, as are related methods. Some of the multi-port devices may have two input ports and two output ports, and may be driven differentially, in a single-ended mode, in a single-ended to differential mode, or in a differential to single-ended mode. The multi-port devices may include one or more transducers coupled to the electrical ports.

24 Claims, 29 Drawing Sheets

(56) References Cited

U.S. PATENT DOCUMENTS

| | | | |
|---|---|---|---|
| 6,516,665 B1* | 2/2003 | Varadan et al. | 73/504.01 |
| 6,566,787 B2* | 5/2003 | Tsukahara et al. | 310/313 R |
| 6,577,040 B2 | 6/2003 | Nguyen | |
| 6,710,680 B2* | 3/2004 | Niu et al. | 333/186 |
| 6,734,762 B2* | 5/2004 | Cornett et al. | 333/186 |
| 6,739,190 B2 | 5/2004 | Hsu et al. | |
| 6,828,713 B2 | 12/2004 | Bradley et al. | |
| 6,831,531 B1 | 12/2004 | Giousouf et al. | |
| 6,848,295 B2* | 2/2005 | Auner et al. | 73/24.06 |
| 6,859,113 B2 | 2/2005 | Giousouf et al. | |
| 6,909,221 B2 | 6/2005 | Ayazi et al. | |
| 6,943,484 B2 | 9/2005 | Clark et al. | |
| 6,954,020 B2 | 10/2005 | Ma et al. | |
| 6,987,432 B2 | 1/2006 | Lutz et al. | |
| 6,995,622 B2 | 2/2006 | Partridge et al. | |
| 7,005,946 B2 | 2/2006 | Duwel et al. | |
| 7,068,125 B2 | 6/2006 | Lutz et al. | |
| 7,068,126 B2* | 6/2006 | Huang et al. | 333/186 |
| 7,102,467 B2 | 9/2006 | Lutz et al. | |
| 7,211,926 B2 | 5/2007 | Quevy et al. | |
| 7,215,061 B2 | 5/2007 | Kihara et al. | |
| 7,248,128 B2 | 7/2007 | Mattila et al. | |
| 7,352,608 B2 | 4/2008 | Mohanty et al. | |
| 7,471,028 B2* | 12/2008 | Onozawa | 310/313 R |
| 7,492,241 B2 | 2/2009 | Piazza et al. | |
| 7,504,909 B2 | 3/2009 | Tada | |
| 7,535,152 B2* | 5/2009 | Ogami et al. | 310/313 A |
| 7,616,077 B1* | 11/2009 | Wittwer et al. | 333/186 |
| 7,639,105 B2* | 12/2009 | Ayazi et al. | 333/186 |
| 7,724,103 B2 | 5/2010 | Feng et al. | |
| 7,728,483 B2* | 6/2010 | Tanaka | 310/313 R |
| 7,791,432 B2 | 9/2010 | Piazza et al. | |
| 2002/0075100 A1 | 6/2002 | Katohno | |
| 2002/0158700 A1 | 10/2002 | Nemoto | |
| 2003/0034852 A1 | 2/2003 | Kobayashi et al. | |
| 2004/0056728 A1 | 3/2004 | Dent et al. | |
| 2005/0073078 A1 | 4/2005 | Lutz et al. | |
| 2006/0196253 A1* | 9/2006 | Crawley et al. | 73/53.01 |
| 2006/0284703 A1 | 12/2006 | Iwasaki et al. | |
| 2007/0052324 A1* | 3/2007 | Chen et al. | 310/313 R |
| 2007/0222336 A1 | 9/2007 | Grannen et al. | |
| 2008/0048804 A1* | 2/2008 | Volatier et al. | 333/191 |
| 2008/0100176 A1* | 5/2008 | Haskell et al. | 310/313 R |
| 2008/0143217 A1 | 6/2008 | Ho et al. | |
| 2008/0204153 A1 | 8/2008 | Yoshida et al. | |
| 2008/0272852 A1 | 11/2008 | Six | |
| 2008/0284286 A1 | 11/2008 | Ogawa et al. | |
| 2008/0297277 A1 | 12/2008 | Meister et al. | |
| 2009/0026882 A1 | 1/2009 | Steeneken et al. | |
| 2009/0108381 A1 | 4/2009 | Buchwalter et al. | |
| 2009/0108959 A1 | 4/2009 | Piazza et al. | |
| 2009/0127697 A1* | 5/2009 | Pahl | 257/698 |
| 2009/0144963 A1 | 6/2009 | Piazza et al. | |
| 2009/2437470 | 10/2009 | Gaidarzhy et al. | |
| 2009/0294638 A1 | 12/2009 | Mohanty et al. | |
| 2010/0007443 A1 | 1/2010 | Mohanty et al. | |
| 2010/0134207 A1 | 6/2010 | Mohanty et al. | |
| 2010/0155883 A1 | 6/2010 | Wenzler et al. | |
| 2010/0182102 A1 | 7/2010 | Kuypers et al. | |

FOREIGN PATENT DOCUMENTS

| | | |
|---|---|---|
| WO | WO 98/01948 A1 | 1/1998 |
| WO | WO 98/37635 A1 | 8/1998 |
| WO | WO 02/17481 A2 | 2/2002 |
| WO | WO 2006/000611 A1 | 1/2006 |
| WO | WO 2006/083482 A2 | 8/2006 |
| WO | WO 2006/126168 A1 | 11/2006 |
| WO | WO 2007/072408 A2 | 6/2007 |
| WO | WO 2007/072409 A2 | 6/2007 |
| WO | WO 2007/143520 A2 | 12/2007 |
| WO | WO 2010/011288 A1 | 1/2010 |

OTHER PUBLICATIONS

Driscoll et al., "Voltage-controlled crystal oscillators," *IEEE Trans. On Electron Devices*:ED18(8):528-535 (1971).

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

International Search Report and Written Opinion for International Application No. PCT/US09/06590 mailed Mar. 1, 2010.

International Search Report and Written Opinion for International Application No. PCT/US2010/000301 mailed Sep. 3, 2010.

International Search Report and International Preliminary Report on Patentability for PCT/US2006/021298 mailed Nov. 6, 2006 and Dec. 6, 2007 respectively.

International Search Report and Written Opinion from International Application No. PCT/US09/06587 dated Feb. 26, 2010.

Piazza et al., "Low motional resistance ring-shaped contour-mode aluminum nitride piezoelectric micromechanical resonators for UHF applications," Micro Electro Mechanical Systems, 2005. MEMS 2005. 18$^{th}$ IEEE International Conference on Miami Beach, Florida, Jan. 30-Feb. 3, 2005, Piscataway, New Jersey, US, IEEE Jan. 30, 2005, pp. 20-23.

Tirole et al., "Lamb Waves Pressure Sensor Using an AlN/Si Structure," Proceedings Ultrasonics Symposium, Oct. 31, 1993-Nov. 3, 1993, Baltimore, MD, IEEE 1993 vol. 1, pp. 371-374.

Extended European Search Report from Application No. EP 09 83 6501, dated Aug. 21, 2013, 9 pages.

Kuypers et al., "Green's Function Analysis of Lamb Wave Resonators," IEEE, 2008, pp. 1548-1551.

Kuypers et al., "Intrinsic Temperature Compensation of Aluminum Nitride Lamb Wave Resonators for Multiple-Frequency References," IEEE, 2008, pp. 240-249.

\* cited by examiner

Differential mode operation

Mode conversion (common to differential)

Differential mode operation

Mode conversion (common to differential)

Differential mode operation

Mode conversion (common to differential)

Differential mode operation

Mode conversion (common to differential)

Differential mode operation

Mode conversion (common to differential)

MULTI-PORT MECHANICAL RESONATING DEVICES AND RELATED METHODS

RELATED APPLICATIONS

The present application claims the benefit of U.S. Provisional Patent Application Ser. No. 61/172,003, filed Apr. 23, 2009 and titled "Multi-Port Mechanical Resonating Devices and Related Methods," which is hereby incorporated herein by reference in its entirety.

The present application also claims the benefit of U.S. Provisional Patent Application Ser. No. 61/138,171, filed Dec. 17, 2008 and titled "Mechanical Resonating Structures Including a Temperature Compensation Structure," which is hereby incorporated herein by reference in its entirety.

The present application also claims the benefit of U.S. Provisional Patent Application Ser. No. 61/149,815, filed Feb. 4, 2009 and titled "Methods and Apparatus for Tuning Oscillators," which is hereby incorporated herein by reference in its entirety.

The present application also claims the benefit of U.S. Provisional Patent Application Ser. No. 61/184,138, filed Jun. 4, 2009 and titled "Methods and Apparatus for Tuning Devices Having Mechanical Resonators," which is hereby incorporated herein by reference in its entirety.

BACKGROUND

1. Field

The technology described herein relates to multi-port mechanical resonating devices and related methods.

2. Related Art

Mechanical resonators include a mechanical structure configured to vibrate in at least one dimension. Typical mechanical resonators are operated in a single-ended mode, receiving a single input signal and producing a single output signal. The input signal is received on an electrical input port, and the output signal is produced at an electrical output port. For some mechanical resonators, the input port is connected to an input electrode of the resonator, and the output port is connected to an output electrode of the resonator, different from the input electrode.

SUMMARY

Multi-port mechanical resonating devices and related methods are described. In some embodiments, the multi-port mechanical resonating devices are configured and operated differentially.

According to one aspect, a device is provided comprising a suspended mechanical resonating structure comprising four electrical ports.

According to another aspect, a device comprises a mechanical resonating structure comprising four electrical ports and having a thickness less than approximately three wavelengths of a resonance frequency of the mechanical resonating structure.

According to another aspect, a device comprises a substantially planar suspended mechanical resonating structure comprising a piezoelectric material and configured to support Lamb waves. The mechanical resonating structure comprises four electrodes. The device further comprises four electrical ports, one electrical port being coupled to each of the four electrodes. Two of the four electrical ports are configured to receive a differential input signal and two of the four electrical ports provide a differential output signal from the mechanical resonating structure. The device further comprises a plurality of anchors coupling the mechanical resonating structure to a substrate.

According to another aspect, a method of operating a suspended mechanical resonating structure is provided, comprising differentially exciting the suspended mechanical resonating structure.

According to another aspect, a method of operating a suspended mechanical resonating structure configured to support Lamb waves and coupled to four electrical ports is described. The method comprises applying a first end of a differential input signal to a first electrical port of the four electrical ports, and applying a second end of the differential input signal to a second electrical port of the four electrical ports. The method further comprises producing a first end of a differential output signal on a third electrical port of the four electrical ports, and producing a second end of the differential output signal on a fourth electrical port of the four electrical ports. The differential input signal has a frequency approximately equal to a frequency of a Lamb wave supported by the mechanical resonating structure.

BRIEF DESCRIPTION OF THE DRAWINGS

Various embodiments of the technology will be described with reference to the following figures. It should be appreciated that the figures are not necessarily drawn to scale. The same reference number in multiple figures identifies the same item.

DETAILED DESCRIPTION

Mechanical resonating devices having multiple electrical ports are described. According to some aspects of the technology, the mechanical resonating devices include four electrical ports. Each of the four ports may receive an input signal, provide an output signal, or receive a bias signal. According to some aspects, the four electrical ports may be connected and operated differentially (e.g., with two input ports receiving a differential input signal and two output ports producing a differential output signal). The electrical ports may be connected to electrodes of the mechanical resonating device that are arranged to form one or more transducers.

The aspects described above, as well as additional aspects, are now further described. These aspects may be used individually, all together, or in any combination of two or more, as the technology is not limited in this respect.

Figure 1:
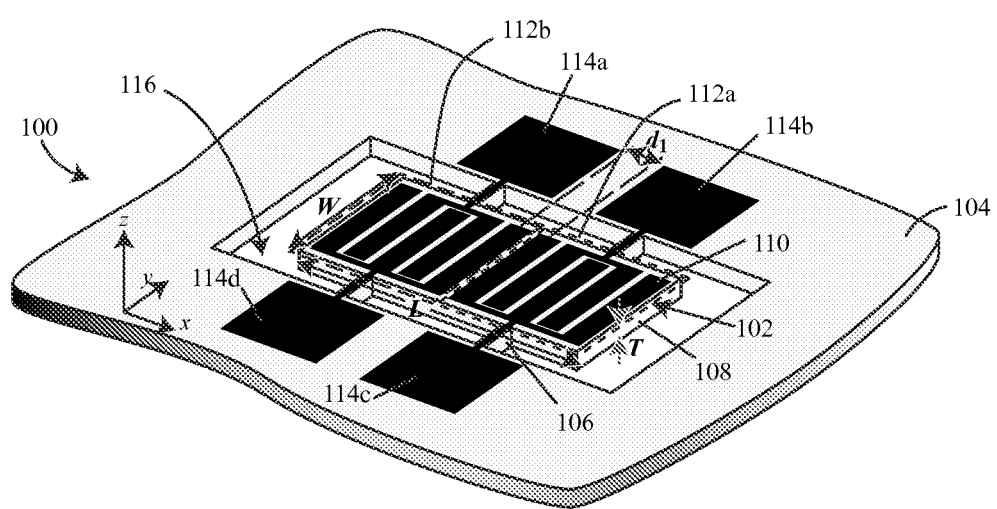
FIG. 1 illustrates a device having four electrical ports, according to one embodiment.

FIG. 1 illustrates a multi-port device according to one embodiment. The device 100 comprises a mechanical resonating structure 102 and four electrical ports 114a-114d. The mechanical resonating structure 102 is coupled to a body 104 (e.g., a substrate or any other suitable body, which in some situations may be fixed) by anchors 106, and comprises a base 108 on which multiple electrodes 110 are formed. In this embodiment, the electrodes 110 are the individual strips extending along the width W of the mechanical resonating structure 102, such that the non-limiting example of mechanical resonating structure 102 comprises ten electrodes. However, not all embodiments are limited to this configuration and/or number of electrodes. The electrodes 110 are arranged to form two transducers, 112a and 112b, of interleaved electrodes, outlined by the dashed boxes. However, it should be appreciated that transducers may have any number and configuration of electrodes, as 112a and 112b are merely non-limiting examples. The mechanical resonating structure 102 is suspended within an air cavity 116, and also includes a length L and a thickness T.

The mechanical resonating structure 102 may be of any suitable type, as the various aspects of the technology are not limited in this respect, and the specific non-limiting example illustrated in FIG. 1 is merely shown for purposes of illustration. Thus, aspects of the technology may apply to mechanical resonating structures of various materials/compositions, shapes, sizes, and/or methods of actuation and/or detection. In addition, aspects of the technology may apply to multi-port devices including various types of mechanical resonating structures, such as resonators, filters, sensors, or other suitable structures.

For example, the mechanical resonating structure may comprise or be formed of any suitable material(s) and may have any composition. According to some embodiments, the mechanical resonating structure may comprise or be formed of a piezoelectric material. According to some embodiments, the mechanical resonating structure comprises quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenside (GaAs), barium sodium niobate, bismuth germanium oxide, indium arsenide, indium antimonide), either in substantially pure form or in combination with one or more other materials. Moreover, in some embodiments in which the mechanical resonating structure comprises a piezoelectric material, the piezoelectric material may be single crystal material. According to some embodiments, the base 108 may comprise any of those materials listed, or any other suitable materials.

According to some embodiments, the mechanical resonating structure comprises or is formed of multiple layers, making the structure a composite structure. For example, the mechanical resonating structure 102 comprises a base 108 on which electrodes 110 are formed. In addition, the base 108 may itself comprise one or more layers of differing materials, shapes, and/or thicknesses, as described further below.

The mechanical resonating structure may have any shape. For example, aspects of the technology may apply to mechanical resonating structures that are substantially rectangular (as shown in FIG. 1), substantially ring-shaped, substantially disc-shaped, or that have any other suitable shape. Moreover, the mechanical resonating structure may have one or more beveled edges. According to some embodiments, the mechanical resonating structure may be substantially planar, such as the mechanical resonating structure 102 of FIG. 1.

The mechanical resonating structures described herein may have any suitable dimensions. According to some embodiments, the mechanical resonating structure 102 has a thickness T, which in some embodiments is less than approximately three wavelengths of a resonance frequency of interest of the mechanical resonating structure. According to some embodiments, the thickness T is less than approximately two wavelengths of the resonance frequency of interest. In still other embodiments, the thickness T may be less than approximately one wavelength of the resonance frequency of interest (e.g., less than approximately one wavelength of a resonant Lamb wave supported by the mechanical resonating structure, as described further below). The thickness may determine or depend on the types of waves supported by the mechanical resonating structure. For example, a given thickness may limit the ability of the mechanical resonating structure to support Lamb waves, or certain modes of Lamb waves. Thus, it should be appreciated that the thickness may be chosen in dependence on the types and/or modes of waves desired to be supported by the mechanical resonating structure. Thus, it should also be appreciated that thickness values other than those listed may be suitable for some applications, and that the various aspects described herein are not limited to using mechanical resonating structures having any particular thickness values.

According to some embodiments, the mechanical resonating structures described herein have a large dimension (e.g., the largest of length, width, diameter, circumference, etc.) of less than approximately 1000 microns, less than 100 microns, less than 50 microns, or any other suitable value. It should be appreciated that other sizes are also possible. According to some embodiments, the devices described herein form part or all of a microelectromechanical system (MEMS).

The mechanical resonating structures may have any desired resonance frequency or frequencies, as the various aspects described herein are not limited to use with structures having any particular frequency operating range or resonance frequency. For example, the resonance frequency of the mechanical resonating structures may be between 1 kHz and 10 GHz. In some embodiments, the frequencies of operation of the mechanical resonating structure are in the upper MHz range (e.g., greater than 100 MHz), or at least 1 GHz (e.g., between 1 GHz and 10 GHz). In some embodiments, the output signals produced by the mechanical resonating structures may have a frequency of at least 1 MHz (e.g., 13 MHz, 26 MHz) or, in some cases, at least 32 kHz. In some embodiments, the operating frequency may range from 30 to 35 kHz, 60 to 70 kHz, 10 MHz to 1 GHz, 1 GHz to 3 GHz, 3 GHz to 10 GHz, or any other suitable frequencies.

The mechanical resonating structure 102 may be actuated and/or detected in any suitable manner, with the particular type of actuation and/or detection depending on the type of mechanical resonating structure, the desired operating characteristics, or any other suitable criteria. For example, suitable actuation and/or detection techniques include, but are not limited to, piezoelectric techniques, electrostatic techniques, magnetic techniques, thermal techniques, piezoresistive techniques, any combination of those techniques listed, or any other suitable techniques. The various aspects of the technology described herein are not limited to the manner of actuation and/or detection.

According to some embodiments, the mechanical resonating structures described herein may be piezoelectric Lamb wave devices, such as piezoelectric Lamb wave resonators, having multiple ports (e.g., four or more ports). Such Lamb wave devices may operate based on propagating acoustic waves (e.g., propagating acoustic waves in base 108), with the edges of the structure (e.g., the edges of mechanical resonating structure 102) serving as reflectors for the waves. For such devices, the spacing between the plate edges may define the resonance cavity, and resonance may be achieved when the cavity is an integer multiple of p, where p=λ/2, with λ being the acoustic wavelength of the Lamb wave of interest, understanding that the device may support more than one mode of Lamb waves. However, it should be appreciated that aspects of the technology described herein apply to other types of structures as well, and that Lamb wave structures are merely non-limiting examples.

According to some embodiments, the mechanical resonating devices comprise a mechanical resonator, such as shown in FIG. 1. Suitable mechanical resonators have been described, for example, in PCT Patent Publication No. WO 2006/083482, and in U.S. patent application Ser. No. 12/142, 254, filed Jun. 19, 2008 and published as U.S. Patent Application Publication 2009/0243747, all of which are incorporated herein by reference in their entireties. However, such examples are non-limiting, as various other types of mechanical resonators, and mechanical resonating structures may alternatively be used.

As mentioned with respect to FIG. 1, some embodiments include suspended mechanical resonating structures. The structures may be suspended in that they may have one or more segments which are not directly attached to any other structures. For example, in FIG. 1 the ends of the mechanical resonating structure 102 are not directly attached to the body 104. It should be appreciated that various forms of "suspended" structures may be used, including, but not limited to, structures having any one or more free surfaces.

In some embodiments, suspended mechanical resonating structures may be coupled to a relatively stationary support structure, such as a substrate, by any suitable type, number, and configuration of anchors (e.g., anchors 106 in FIG. 1). In some embodiments, the number of anchors may equal the number of electrical ports of the mechanical resonating structure. However, not all embodiments are limited in this respect. For example, the number of anchors, which may be two or more according to various embodiments, may be selected based on a desired degree of support to be provided by the anchors (e.g., a greater number of anchors may make the device more resilient or rugged), a desired quality factor Q of the mechanical resonating structure (e.g., a greater number of anchors may lower Q), and/or a desire to suppress any particular modes of vibration of interest (e.g., the number of anchors may be selected, and the anchors configured, to suppress certain undesirable modes of vibration). According to some embodiments of the present invention, suspended mechanical resonating structures may be coupled to a substrate (or other supporting structure) by two anchors, by six anchors, by eight anchors, by ten anchors, or by any other suitable number of anchors given the considerations outlined above.

Figure 21:
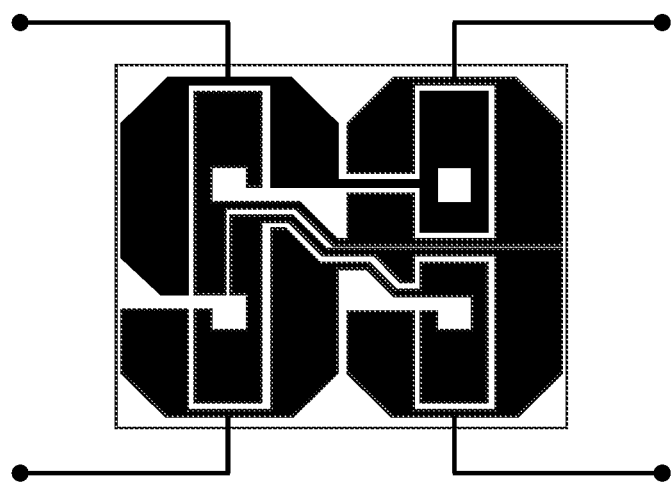
FIG. 21 illustrates an electrode configuration of a multi-port mechanical resonating structure, according to one non-limiting embodiment of the present invention.

As previously mentioned, mechanical resonating structures described herein may have any suitable type, number, and configuration of electrodes, as the electrodes 110 represent only one non-limiting example. For example, the electrodes may be formed of any suitable material. Any number of electrodes may be included. For example, in some embodiments, one electrode is connected to each of the electrical ports. In other embodiments, such as the non-limiting example of FIG. 1, more than one electrode may be connected to each electrical port. In some embodiments, the electrodes are individual strips, such as those shown in FIG. 1. However, the electrodes may take any suitable shape. For example, two or more of the electrodes 110 in FIG. 1 may form a single electrode in some embodiments. The electrodes 110, while shown as extending along substantially the entire width W, may alternatively extend along only a part of the width (e.g., half the width, a quarter of the width, etc.). Other configurations are also possible, as the various structures herein including electrodes are not limited to any particular number, shapes, or configurations of electrodes, unless so stated. For example, FIG. 21 illustrates a non-limiting electrode configuration which may be used with a mechanical resonating structure having four electrical ports, according to one non-limiting embodiment. Thus, it should be appreciated that the examples of electrode configurations described herein are not limiting.

The electrical ports 114a-114d may have any suitable size and shape, and may be formed of any suitable material(s). According to some embodiments, one or more of the electrical ports comprise a conductive material (e.g., a metal, a doped semiconductor, or any other suitable conductive material). According to some embodiments, the electrical ports are formed on a body (e.g., body 104 of FIG. 1), while in other embodiments the electrical ports may be formed at least partially within the body and then accessed through an exposed surface of the body. Other configurations are also possible, as the various aspects described herein are not limited to having electrical ports on or in the body, but rather the electrical ports may be placed in other positions relative to the mechanical resonating devices. In addition, it should be appreciated that the various aspects described herein are not limited to structures having four electrical ports, as some embodiments may include more than four electrical ports.

The electrical ports may be accessed, for example to receive and/or provide electrical signals, in any suitable manner. According to some embodiments, the electrical ports may be accessed externally to the device via wire bonding. According to other embodiments, the electrical ports may be connected to conductive traces (e.g., metal traces) which may be connected to drive and/or detection circuitry. Other configurations and types of connections are also possible.

The four electrical ports 114a-114d may be operated in various configurations of input, output, and biased (e.g., grounded) ports. For example, the mechanical resonating structure 102 may be operated in the following modes: (a) differential-to-differential operation; (b) single-ended-to-single-ended operation; (c) single-ended-to-differential operation; or (d) differential-to-single-ended operation. For each of the listed modes, multiple configurations of the electrical ports are also possible. For example, in a differential-to-differential mode, any two of the four ports may be connected as input ports, with the remaining two ports serving as output ports. Thus, the electrical ports 114a-114d may be connected as input, output, and/or grounded ports to operate in any of these modes, and the chosen configuration may be based on the intended application and/or desired operating characteristics, or on any other criteria. In addition, it should be appreciated that not all aspects of the technology described herein are limited to use with devices having four electrical ports. Rather, in some embodiments, the devices may comprise four or more electrical ports.

Figure 2A:
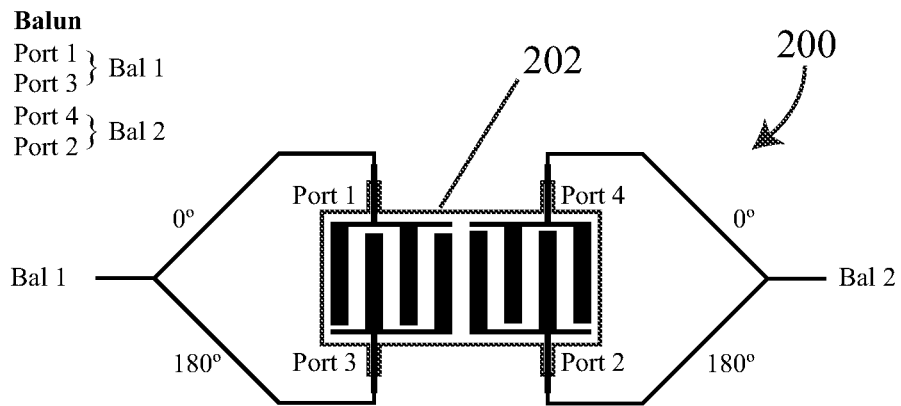
FIG. 2A illustrates a first configuration for differentially operating a device having four electrical ports, such as the device 100 of FIG. 1, according to one embodiment.
Figure 3A:
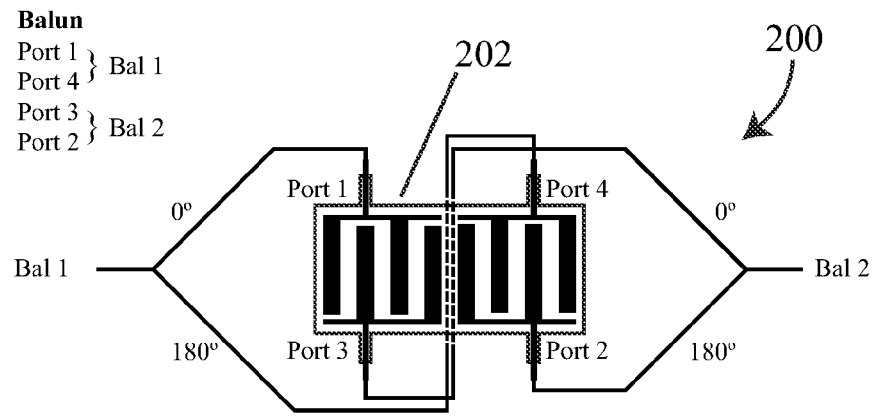
FIG. 3A illustrates a second configuration for differentially operating a device having four electrical ports, such as the device 100 of FIG. 1, according to another embodiment.
Figure 4A:
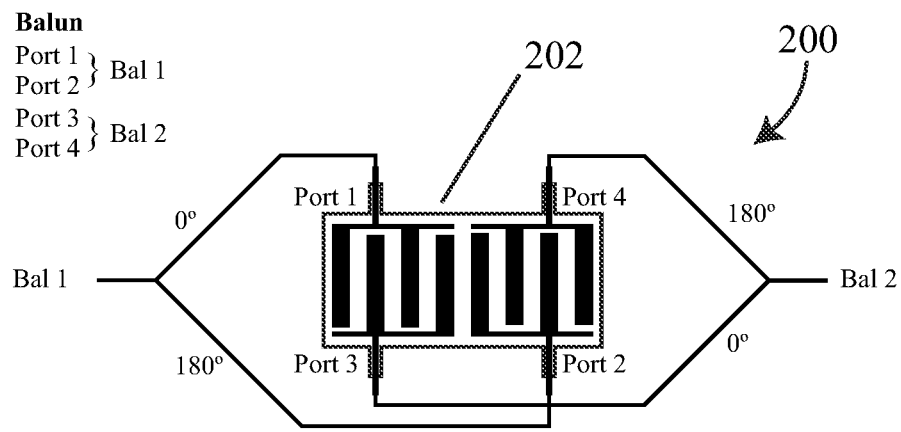
FIG. 4A illustrates a third configuration for differentially operating a device having four electrical ports, such as the device 100 of FIG. 1, according to another embodiment.

According to some embodiments, the device 100 is operated in a differential-to-differential mode. In such a mode, any two of the electrical ports 114a-114d may serve as input ports, being differentially excited by a differential input signal, with the remaining two electrical ports serving as output ports. Thus, various configurations of the ports are possible within this mode. FIGS. 2A, 3A, and 4A illustrate three examples.

FIG. 2A illustrates one non-limiting example of a differential configuration of a four port device. The four port device 200 comprises a mechanical resonating structure 202, which is substantially the same as mechanical resonating structure 102 of FIG. 1, except for having a different electrode configuration. As shown, the mechanical resonating structure 202 comprises four ports, Port 1-Port 4. In this non-limiting example, Port 1 and Port 3 are differentially excited (also referred to herein as differentially driven) (i.e., Port 1 receives a first end of a differential input signal and Port 3 receives a second end of the differential input signal, where the "ends" of the differential signal are the two opposing signals making up the differential signal), and Ports 4 and 2 provide a differential output signal (i.e., Port 4 provides a first end of the differential output signal and Port 2 provides the second end of the differential output signal).

Figure 2B:
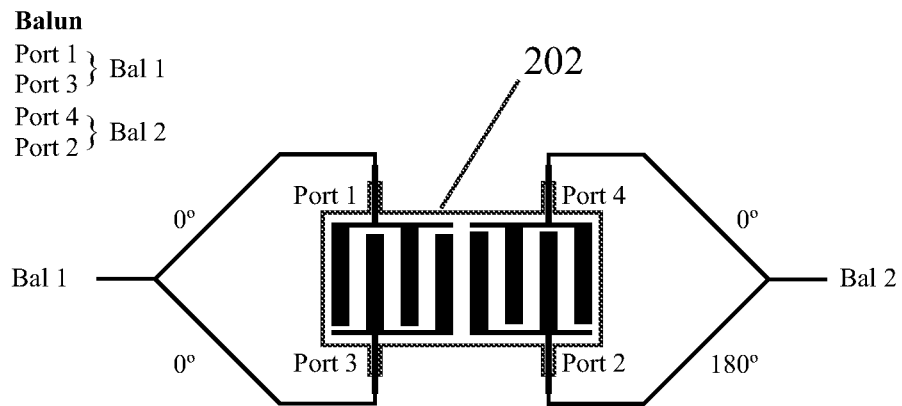
FIG. 2B illustrates the configuration of common mode conversion corresponding to FIG. 2A.

In practice, the differential input signal applied to Ports 1 and 3 in FIG. 2A may include a common mode portion, for example representing noise on the differential input signal or otherwise. As shown in FIG. 2B, inputting a common mode signal (e.g., a common mode portion, if any, of a differential input signal) to Ports 1 and 3 may produce a corresponding differential output signal on Ports 4 and 2. The differential output signal produced by the common mode input on Ports 1 and 3 may be undesirable in some operating situations, such that it may be desirable to minimize this differential output signal.

Figure 2C:
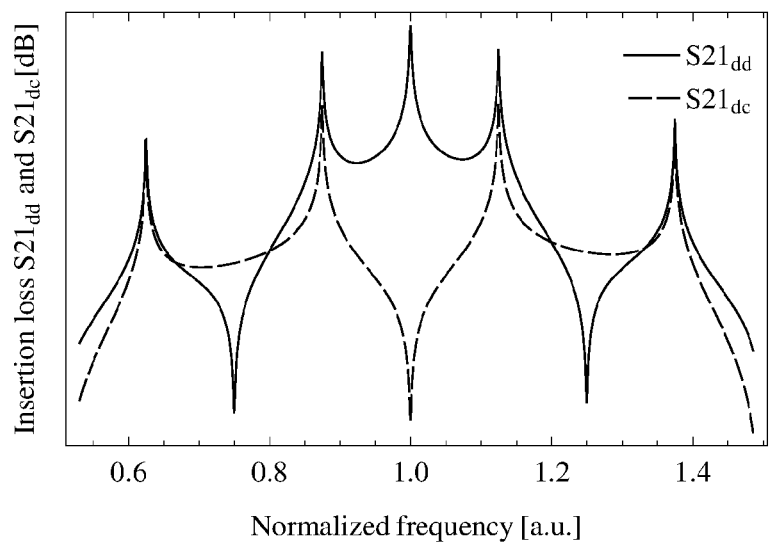
FIGS. 2C-2D illustrate operating characteristics of the configurations of FIGS. 2A-2B.
Figure 2D:
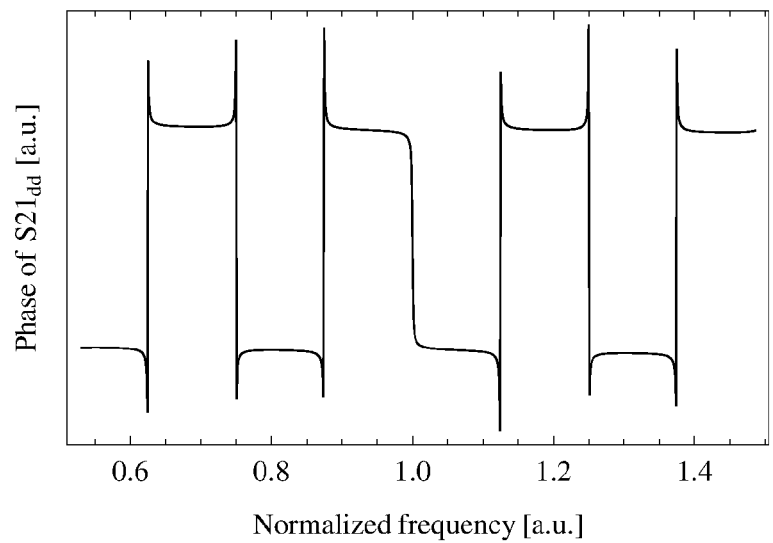

FIGS. 2C and 2D illustrate performance characteristics of the excitation scheme illustrated in FIGS. 2A and 2B. FIG. 2C illustrates the magnitude of the transmission coefficients $S21_{dd}$ and $S21_{dc}$ as a function of frequency. The y-axis shows the magnitude in decibels (dB), and the x-axis shows the normalized frequency in arbitrary units (a.u.). The frequency is normalized with respect to a resonance frequency of the mechanical resonating structure 202.

The transmission coefficient $S21_{dd}$ provides an indication of the power going through the device for termination of a given characteristic impedance $Z_0$ for the differential-to-differential signal scheme of FIG. 2A, with a large value of $S21_{dd}$ representing large power throughput. The transmission coefficient $S21_{dc}$ provides an indication of the magnitude of the differential output signal produced by a common mode input signal, as shown in FIG. 2B, with a large value of $S21_{dc}$ representing a large power throughput. As mentioned, for some applications, it is desirable for the mechanical resonating structure to minimize or prevent the influence of the common mode input signal on the device operation, such that a smaller value of $S21_{dc}$ is desirable. For other applications, it may be desirable to maximize the influence of the common mode input signal, such that a larger value of $S21_{dc}$ is desirable. Similarly, depending on the application, it may be desirable for $S21_{dd}$ to be large or small. As shown in FIG. 2C, $S21_{dd}$ approaches a maximum value at the resonance frequency (i.e., for a normalized frequency of approximately 1), while $S21_{dc}$ approaches a minimum value at the resonance frequency.

FIG. 2D illustrates the phase of $S21_{dd}$ as a function of normalized frequency. The y-axis represents the magnitude of the phase in arbitrary units (a.u.), while the x-axis represents the normalized frequency, with the frequency being normalized to the resonance frequency of the mechanical resonating structure.

Figure 3B:
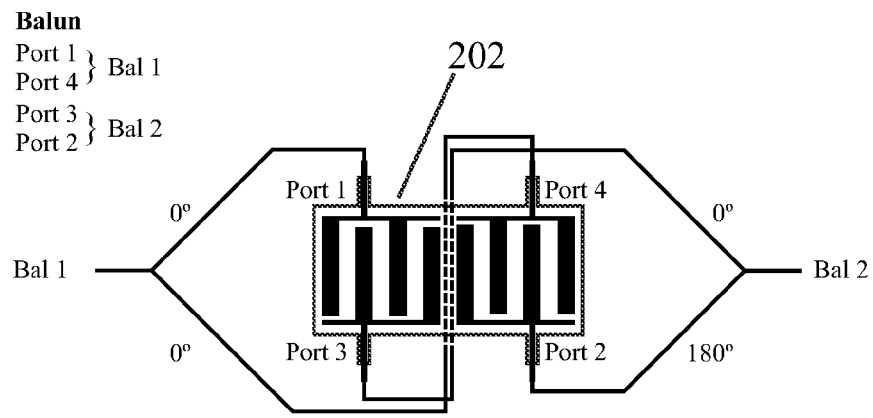
FIG. 3B illustrates the configuration of common mode conversion corresponding to FIG. 3A.

FIG. 3A illustrates a second example of a configuration for differentially operating the mechanical resonating structure 202. In this non-limiting example, Ports 1 and 4 are differentially excited (i.e., Port 1 receives a first end of a differential input signal and Port 4 receives a second end of a differential input signal), with Ports 3 and 2 producing a differential output signal (i.e., Port 3 produces a first end of the differential output signal and Port 2 produces a second end of the differential output signal). As with the differential configuration of FIG. 2A, the differential configuration of FIG. 3A may be accompanied, either intentionally or as an unintended result, by a common mode conversion scheme in which a common mode signal on Ports 1 and 4 is converted to a differential output signal on Ports 3 and 2. FIG. 3B illustrates the common mode conversion situation.

Figure 3C:
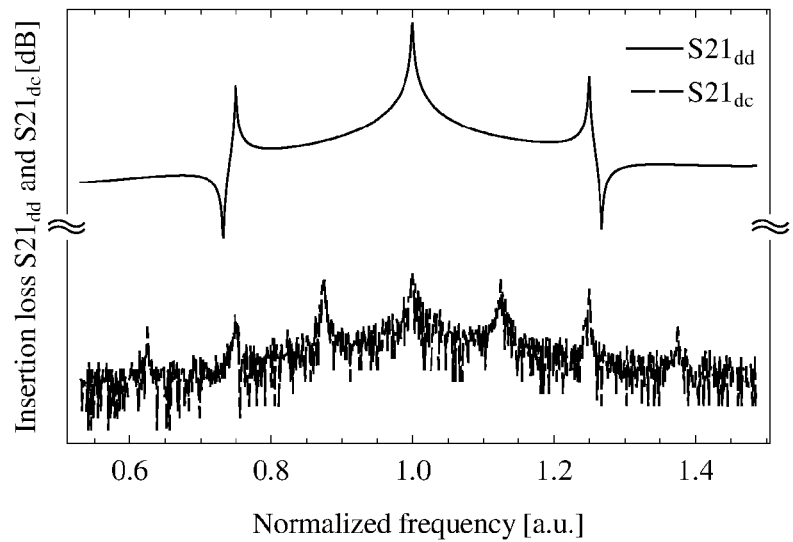
FIGS. 3C-3D illustrate operating characteristics of the configurations of FIGS. 3A-3B.
Figure 3D:
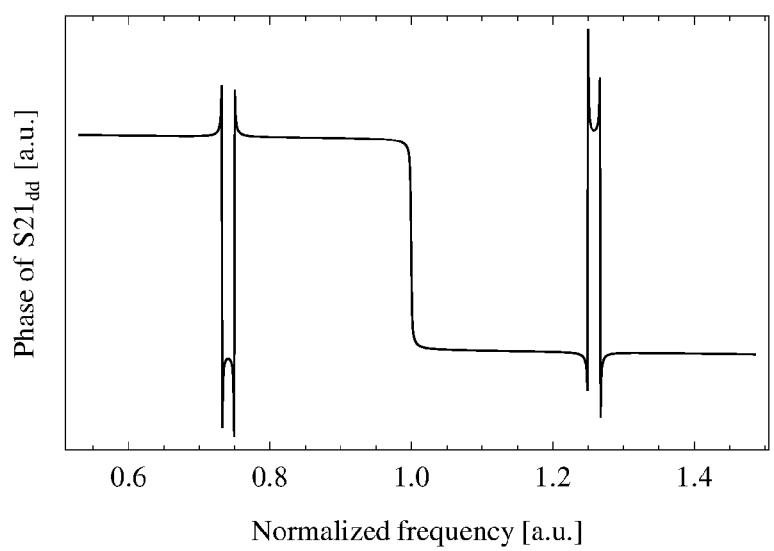

FIGS. 3C and 3D illustrate operating characteristics of the excitation schemes of FIGS. 3A and 3B. FIG. 3C illustrates the magnitude of the transmission coefficients $S21_{dd}$ and $S21_{dc}$ as a function of normalized frequency, with the y-axis and x-axis having the same units as that of FIG. 2C. However, it should be appreciated in FIG. 3C that the y-axis is broken (as indicated by the double curved lines on each side), since the values of $S21_{dd}$ and $S21_{dc}$ are significantly different for this configuration. FIG. 3D illustrates the phase of $S21_{dd}$ as a function of normalized frequency, with the y-axis and x-axis having the same units as that of FIG. 2D.

Figure 4B:
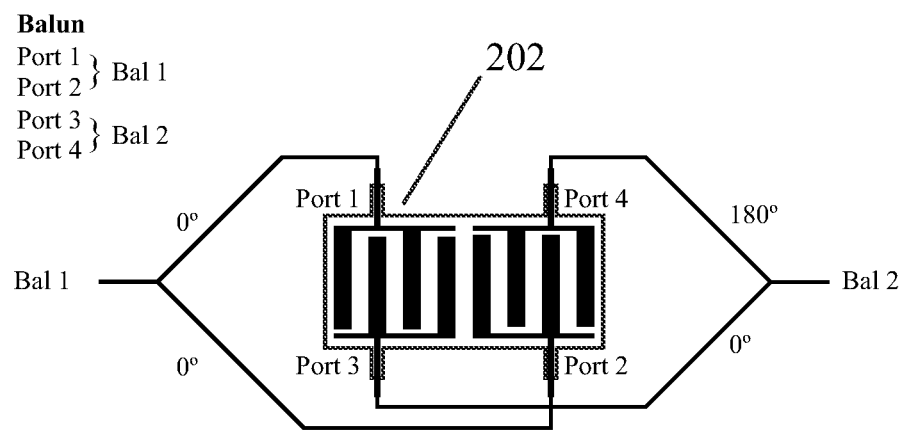
FIG. 4B illustrates the configuration of common mode conversion corresponding to FIG. 4A.

FIG. 4A illustrates a third configuration for differentially operating the mechanical resonating structure 202. As shown, Ports 1 and 2 are driven differentially, with Ports 3 and 4 producing a differential output signal. FIG. 4B illustrates the common mode conversion scheme which may accompany the differential excitation scheme of FIG. 4A.

Figure 4C:
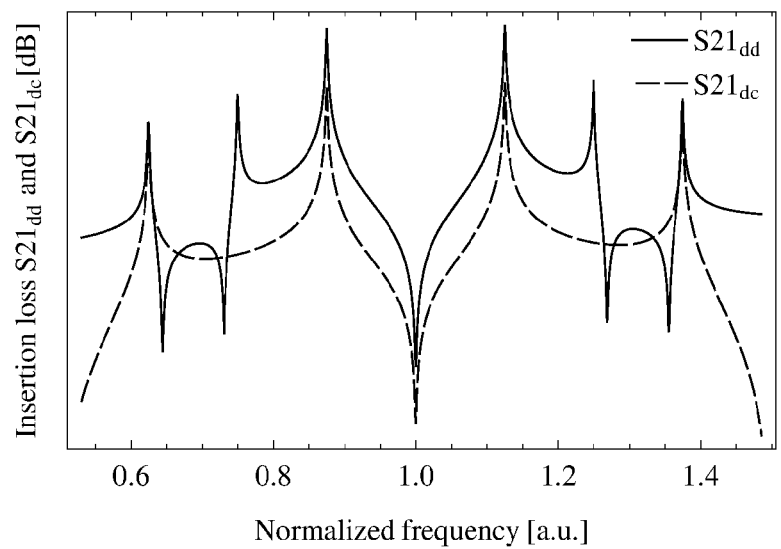
FIGS. 4C-4D illustrate operating characteristics of the configurations of FIGS. 4A-4B.
Figure 4D:
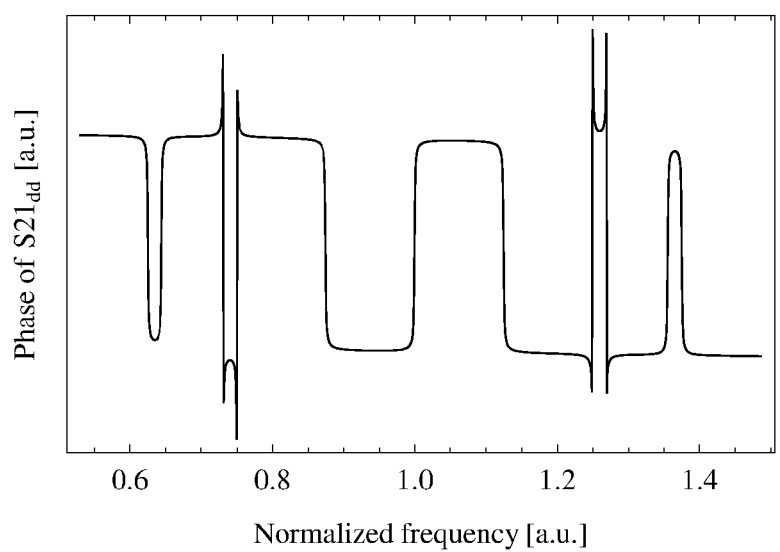

FIGS. 4C and 4D illustrate operating characteristics of the excitation schemes illustrated in FIGS. 4A and 4B. The graphs have the same setup as for FIGS. 2C and 2D, respectively. As shown in FIG. 4C, both $S21_{dd}$ and $S21_{dc}$ approach minimum values at the resonance frequency.

It should thus be appreciated from FIGS. 2A-4D that various differential configurations of a multi-port device may be used to achieve differing operating characteristics.

Also, it should be appreciated that while FIGS. 2-4 illustrate the use of baluns (also abbreviated as "bal" in the figures) to convert differential signals to single-ended and vice versa, devices according to aspects of the present invention are not limited in this respect. Any manner of providing a differential signal to a mechanical resonating structure may be used, as a balun is but one non-limiting example. In addition, differential signals provided by a mechanical resonating structure need not be converted to single-ended signals in all embodiments, whether by a balun or any other method. Furthermore, as explained in multiple places herein, not all embodiments involve application or production of differential signals.

Moreover, while a differential input signal may be applied to devices of the type described herein (e.g., the mechanical resonating structure 202), i.e., a signal having two ends of equal but opposite, or approximately opposite, magnitude (i.e., shifted by 180 degrees or approximately 180 degrees relative to each other for AC signals), modified differential signals may also be applied, either by design or as a result of circuit operation. Such modified differential signals may comprise two ends that are not of equal absolute magnitude and/or that are not 180 degrees out-of-phase with each other. Such differences between the ends of the signal may be intended, or may result from circuit operation (e.g., from noise injected in a feedback loop, or otherwise).

For example, according to some embodiments, two ends of an input signal have approximately equal frequencies and absolute magnitudes, but are out of phase with each other by between 90 and 270 degrees. According to another embodiment, two ends of an input signal have differing absolute magnitudes (i.e., the two ends may be weighted to be of unequal absolute magnitude). Such an excitation scheme may be used to tune the device operation (e.g., by shifting a phase of the input signal) or for any other purpose, as the various aspects employing weighted and/or phase-shifted input signals are not limited to doing so for any particular purpose. According to some embodiments, the device may be configured in a feedback loop, such that the input to the mechanical resonating structure may correspond substantially to the output of the mechanical resonating structure. Therefore, by altering the phase and/or magnitude of the input signal (e.g., the two ends of a differential input signal), the mechanical resonating structure may be tuned, as will also be described below.

As previously mentioned, the device 100 may also be operated in modes other than a differential-to-differential mode. For example, the device 100 may be operated in a single-ended-to-single-ended mode. In such a mode, any two of the electrical ports 114a-114d are grounded. One of the two electrical ports which is not grounded may receive an input signal, and the second of the two non-grounded electrical ports may produce the output signal. Again, any of the electrical ports 114a-114d may serve as the input port, output port, or grounded ports, as the single-ended-to-single-ended modes described herein are not limited in this respect.

According to another embodiment, the device 100 may be operated in a single-ended-to-differential mode. In such a mode, one of the four electrical ports 114a-114d is grounded. One of the electrical ports receives an input (or drive) signal, with the two remaining electrical ports producing a differential output signal. Any of the four electrical ports may be chosen as the grounded port, the input port, and the output ports. Similarly, in a differential-to-single-ended mode, one of the four electrical ports 114a-114d is grounded, two of the electrical ports receive input signals (i.e., different ends of a differential input signal), and the remaining electrical port produces an output signal. Any of the four ports may be used for these three functions in this mode, as the various embodiments described herein are not limited in this respect.

While FIG. 1 illustrates a non-limiting example of a four port device according to aspects of the technology described herein, it should be appreciated that various alterations and modifications may be made. Such modifications may be made to achieve desired operating characteristics, or for any other reason, as the technology described herein is not limited in this respect.

For example, the spacing between transducers 112a and 112b may be varied to achieve desired operating characteristics. As shown in FIG. 1, the transducers 112a and 112b may be spaced apart by a distance $d_1$, which may be measured from the center of adjacent electrodes of the transducers 112a and 112b, as shown. In some embodiments, the spacing equals an integer multiple of p (described above) or an integer multiple of p/2 (i.e., n*p/2, where n is an integer), where p=λ/2, where λ is the resonance wavelength of a desired resonance frequency of the four port device, although not all embodiments are limited in this respect. In some embodiments, the spacing between electrodes and/or transducers may be selected to match a wavelength of interest for a particular mode of vibration of interest, although not all embodiments are limited in this respect. Thus, the various aspects described herein are not limited to any particular spacing between electrodes or transducers of a mechanical resonating structure.

Figure 5A:
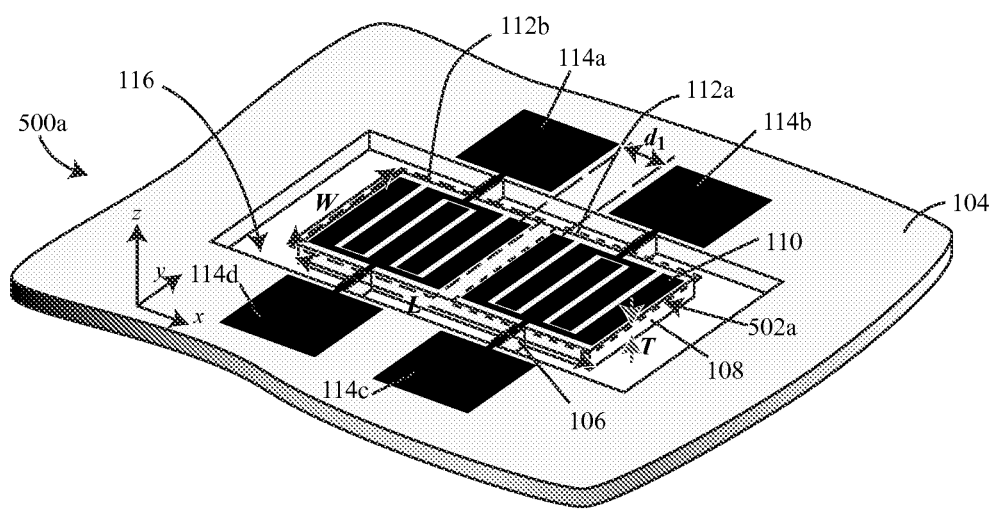
FIGS. 5A-5B illustrate variations on the device of FIG. 1 in which the transducers of the mechanical resonating structure are spaced by different amounts, according to two embodiments.
Figure 5B:
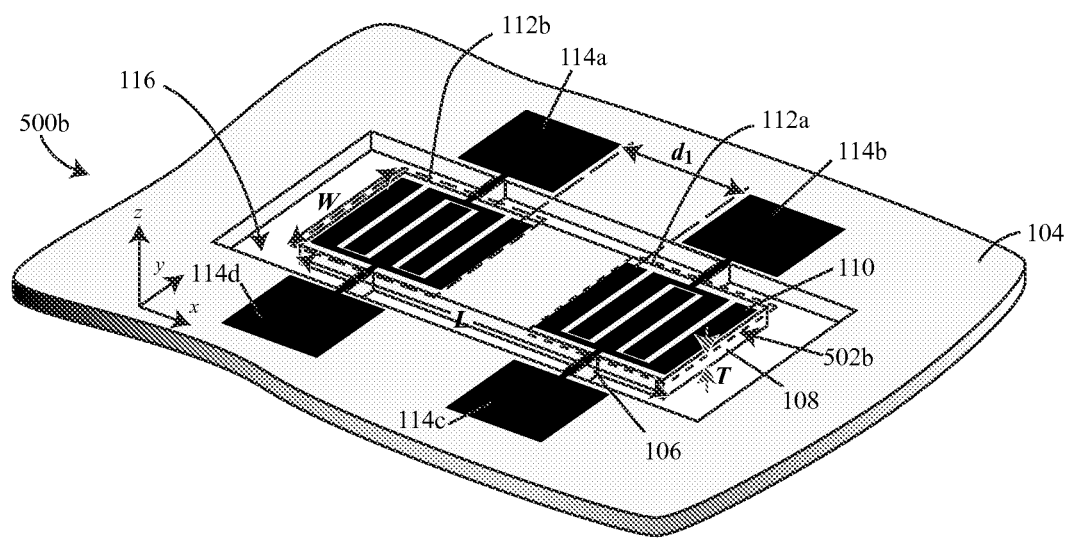

Thus, as shown in FIGS. 5A and 5B, multi-port devices having multiple transducers may be configured with various distances between the transducers. The multi-port device 500a of FIG. 5A is the same as device 100 of FIG. 1, except that the distance $d_1$ between transducers 112a and 112b of the mechanical resonating structure 502a is larger for device 500a than for device 100. Multi-port device 500b in FIG. 5B is the same as device 500a, except that the distance $d_1$ between transducers 112a and 112b of mechanical resonating structure 502b is even larger than for device 500a.

The spacing between the transducers 112a and 112b may impact the operating characteristics of the associated devices. For example, increasing the spacing between the transducers may decrease any cross-coupling ("cross-talk") between the transducers. Additionally, varying the spacing may vary the transfer function of the structure. For example, by varying the spacing to assume differing multiples of p or p/2 (where p=λ/2), the frequency response of $S21_{dd}$ away from the resonance frequency may be altered, although the frequency response of $S21_{dd}$ near the resonance frequency may be approximately the same for all such spacing values. In addition, the degree to which any common mode signal is suppressed may be altered by choosing different spacing values between the transducers. The concept is illustrated by FIGS. 6A-8D.

Figure 6A:
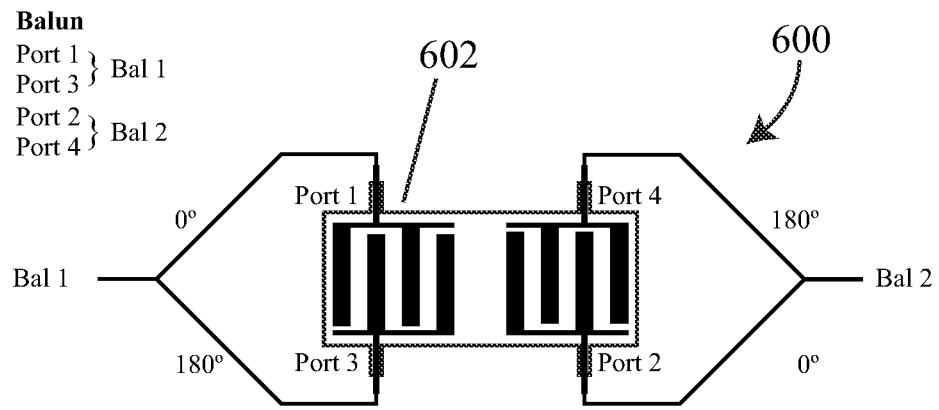
FIG. 6A illustrates a first configuration for differentially operating a device having four electrical ports and greater spacing of transducers than that shown in FIG. 2A, according to one embodiment.
Figure 7A:
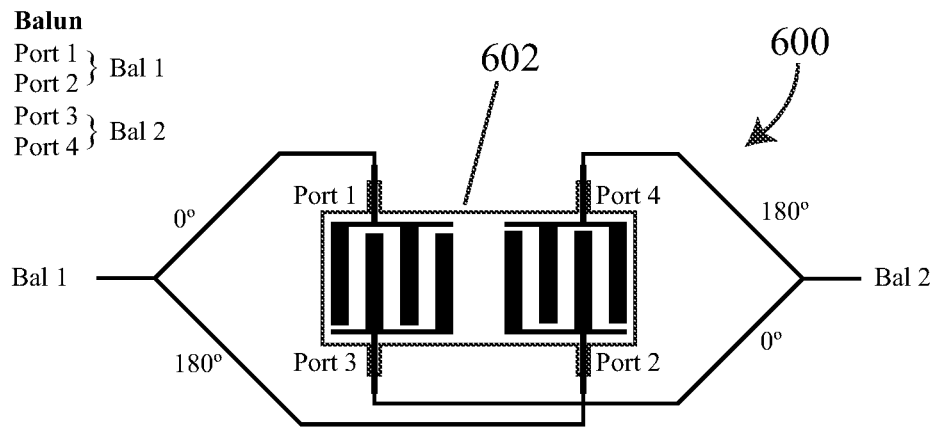
FIG. 7A illustrates a second configuration for differentially operating a device of the type shown in FIG. 6A, according to another embodiment.
Figure 8A:
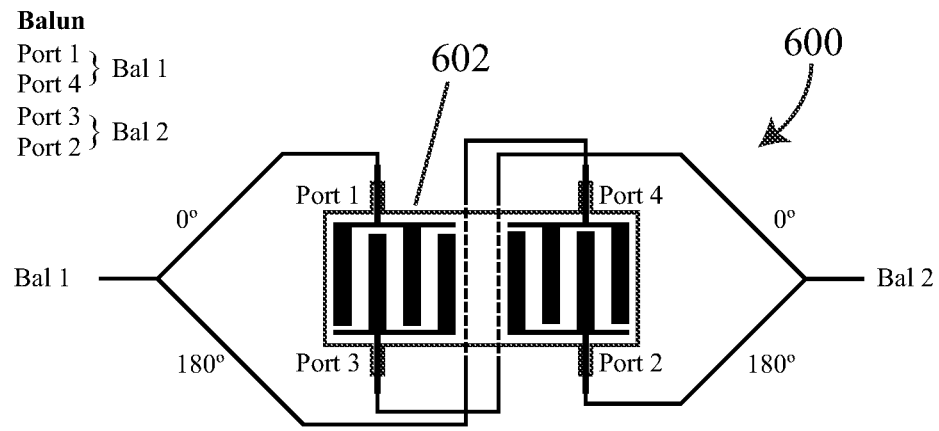
FIG. 8A illustrates a third configuration for differentially operating a device of the type shown in FIG. 6A, according to another embodiment.

FIGS. 6A, 7A, and 8A illustrate various differential configurations in which a four port device 600 having a mechanical resonating structure 602 may be operated. The mechanical resonating structure 602 has a greater distance between its transducers than does the mechanical resonating structure 202.

Figure 6B:
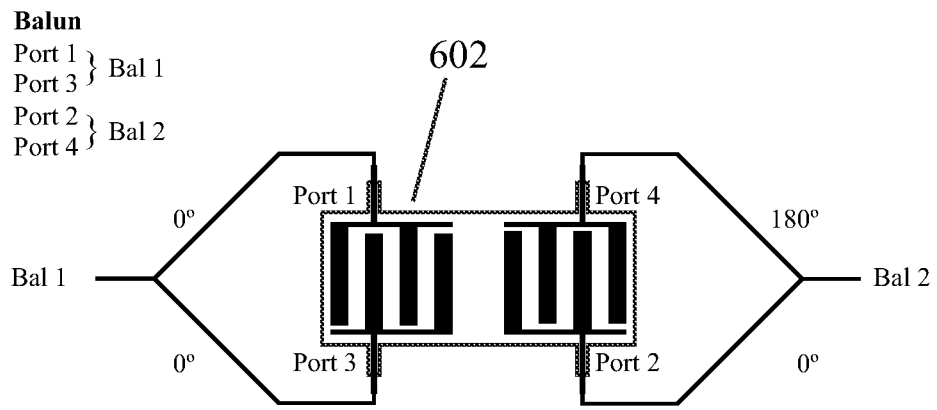
FIG. 6B illustrates the configuration of common mode conversion corresponding to FIG. 6A.
Figure 6C:
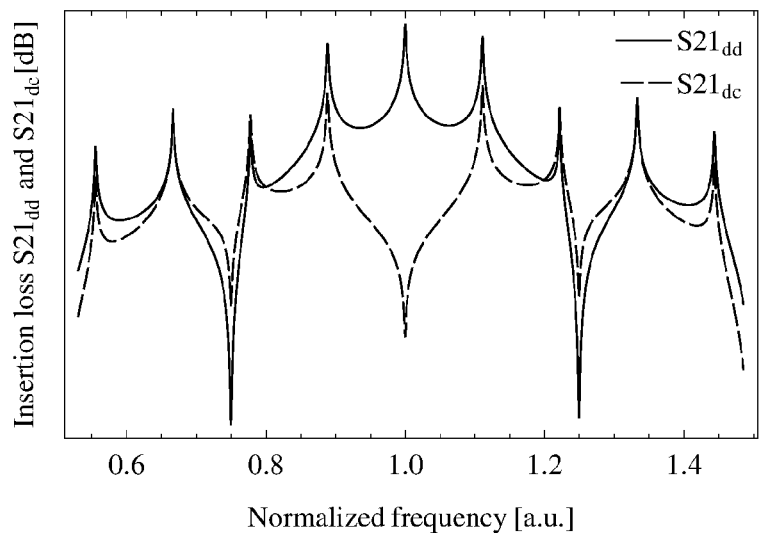
FIGS. 6C-6D illustrate operating characteristics of the configurations of FIGS. 6A-6B.
Figure 6D:
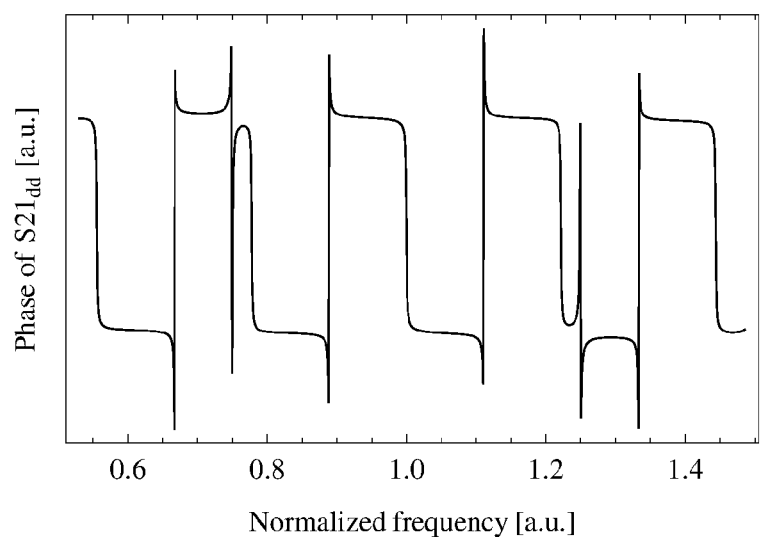
Figure 7B:
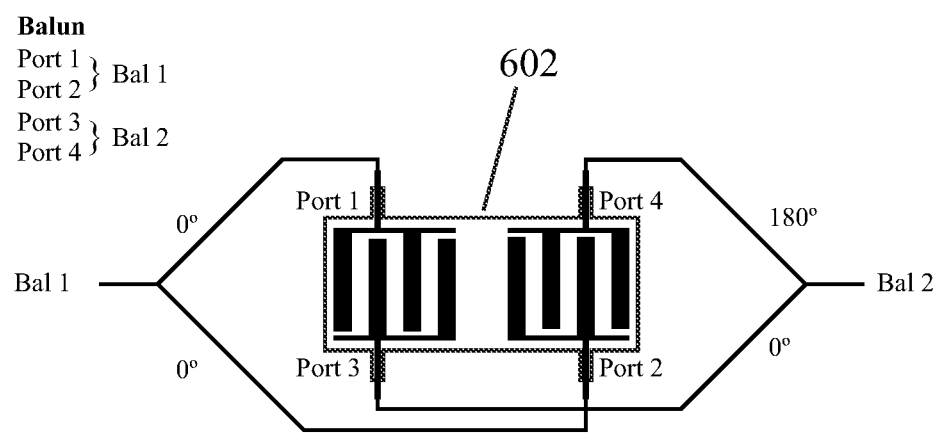
FIG. 7B illustrates the configuration of common mode conversion corresponding to FIG. 7A.
Figure 7C:
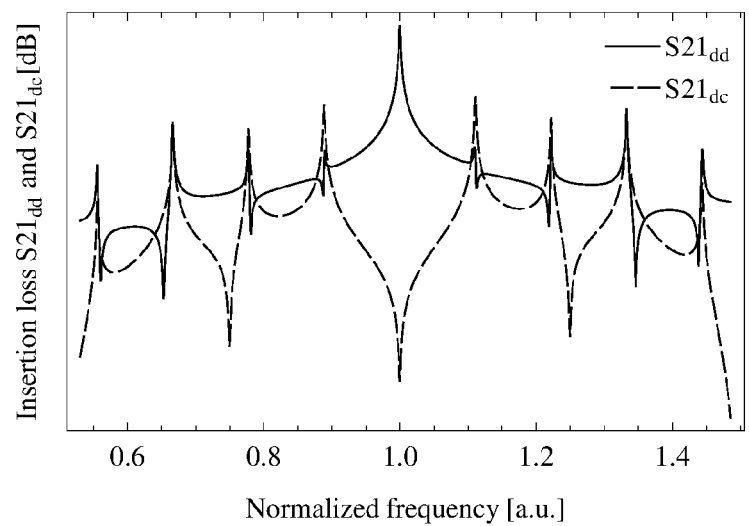
FIGS. 7C-7D illustrate operating characteristics of the configurations of FIGS. 7A-7B.
Figure 7D:
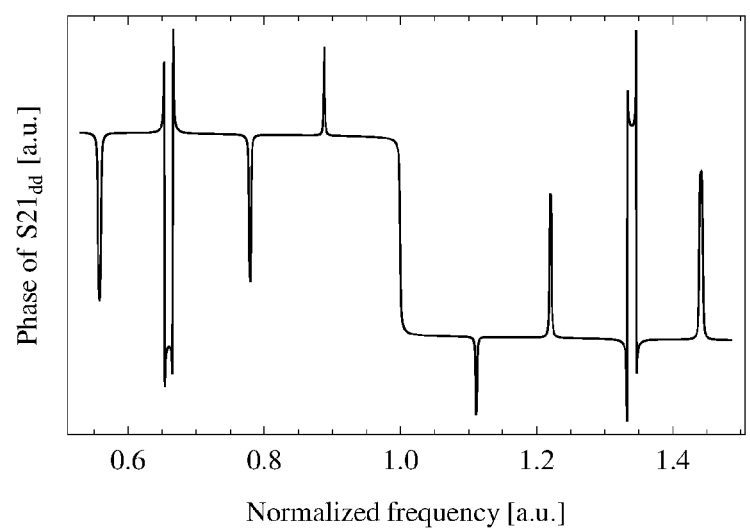
Figure 8B:
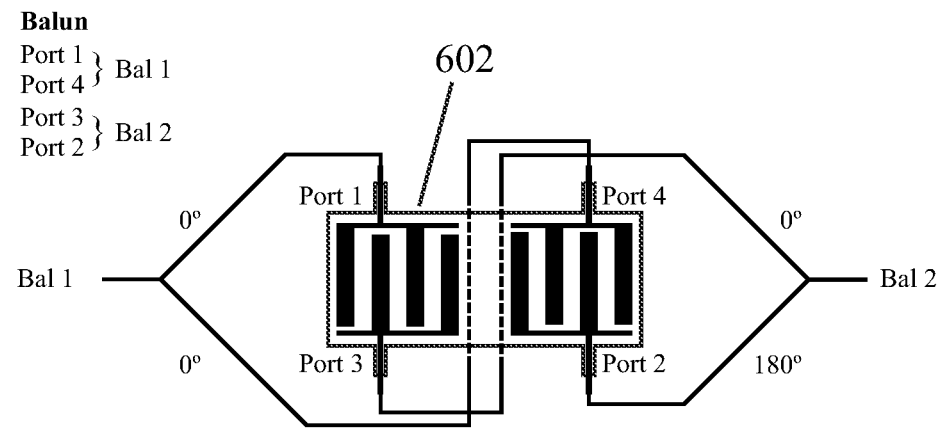
FIG. 8B illustrates the configuration of common mode conversion corresponding to FIG. 8A.
Figure 8C:
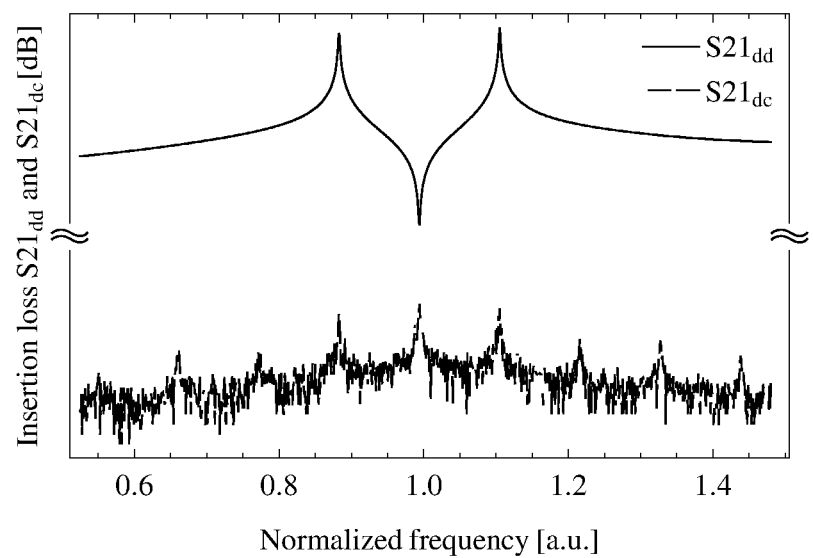
FIGS. 8C-8D illustrate operating characteristics of the configurations of FIGS. 8A-8B.
Figure 8D:
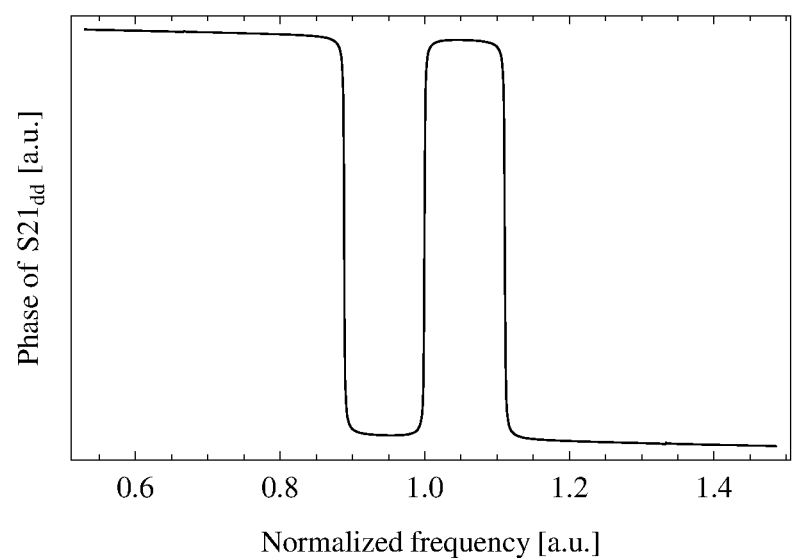

FIGS. 6B, 7B, and 8B illustrate the common mode conversion scheme for the configurations of FIGS. 6A, 7A, and 8A, respectively. FIGS. 6C, 7C, and 8C illustrate $S21_{dd}$ and $S21_{dc}$ for the corresponding configurations of FIGS. 6A-6B, 7A-7B, and 8A-8B, respectively. FIGS. 6D, 7D, and 8D illustrate the phase of $S21_{dd}$ for the configurations of FIGS. 6A, 7A, and 8A, respectively.

It is appreciated by comparing FIGS. 2C-2D, 3C-3D, and 4C-4D to FIGS. 6C-6D, 7C-7D, and 8C-8D, that the spacing between the transducers of a multi-port device such as those shown and described herein impacts the operating behavior of the device. Thus, the spacing may be chosen in dependence on desired operational behavior of the device, in some embodiments.

Figure 9:
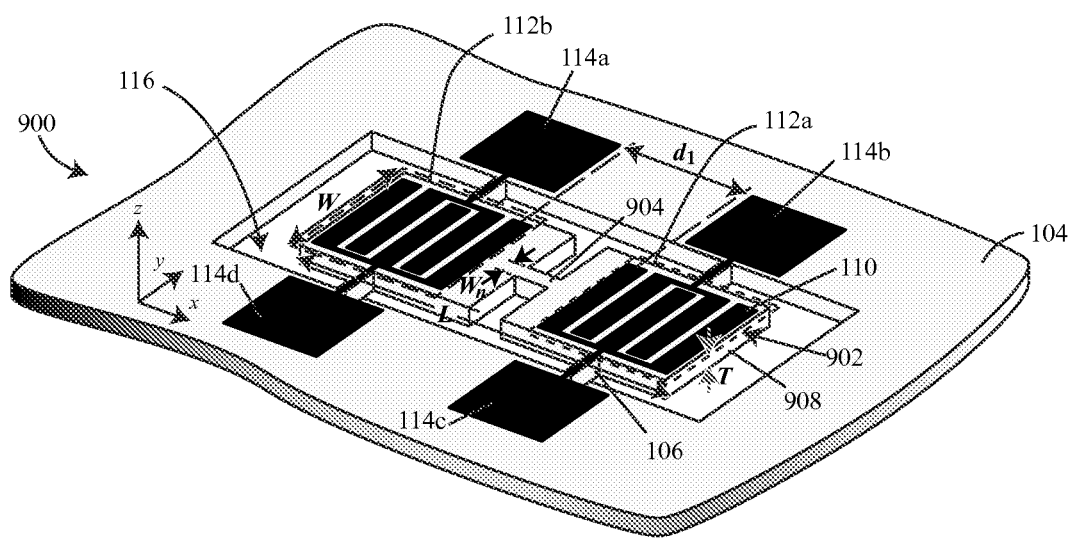
FIG. 9 illustrates a variation on the device 100 of FIG. 1, in which the base of the mechanical resonating structure comprises a neck region.

While the spacing between transducers of a multi-port device is one feature of such devices that may be modified, other modifications may also be made. For example, in those multi-port devices including a mechanical resonating structure, the structure may include a base shaped to form a neck region. As shown in FIG. 9, the device 900 is the same as device 100, except that the base 908 of the mechanical resonating structure 902 includes a neck 904, having a substantially smaller width $W_n$ than the width W of the mechanical resonating structure. The neck 904 may have any suitable dimensions, as the various embodiments employing such necks are not limited in this respect. The neck may cause the mechanical resonating structure 902 to effectively operate as two coupled mechanical resonating structures, rather than a single mechanical resonating structure. Thus, the transducer 112a may be part of a first effective mechanical resonating structure while the transducer 112b may be part of a second effective mechanical resonating structure. Such a configuration may reduce unwanted peaks in the frequency response of the mechanical resonating structure, e.g., resonance peaks more closely spaced to the desired resonance frequency of the structure than can be easily filtered.

It should also be appreciated that various modifications of the device 900 are possible. For example, while a single neck 904 is shown in the example of FIG. 9, other embodiments may comprise multiple necks arranged in parallel. In other embodiments, the neck 904 may be a split beam. Thus, it should be appreciated that the base 908 may be modified to include any one or more neck regions of any suitable shape, size, and configuration.

The device 100 may also, or alternatively, be modified to make the base 108 a multi-layered structure. One or more of the layers may provide temperature compensation functionality, for example to compensate for temperature induced changes in the resonance behavior of the mechanical resonating structure, as will be described in further detail below. Examples of such structures are described in U.S. Pat. App. Ser. No. 61/138,171, filed Dec. 17, 2008 and titled "Mechanical Resonating Structures Including a Temperature Compensation Structure," which is incorporated herein by reference in its entirety, as well as in U.S. patent application Ser. No. 12/639,161, filed Dec. 16, 2009 and titled "Mechanical Resonating Structures Including a Temperature Compensation Structure," which is also incorporated herein by reference in its entirety. If the base is a multi-layered structure, one or more of the layers may be conductive planes. According to some embodiments, the conductive plane(s) may be grounded or biased, while in other embodiments the conductive plane(s) may be floating. The conductive planes may serve as confinement layers to confine the electric fields generated by the electrodes 110, or may serve any other function, as the various embodiments employing conductive planes are not limited in this respect. Two non-limiting examples are now described.

Figure 10A:
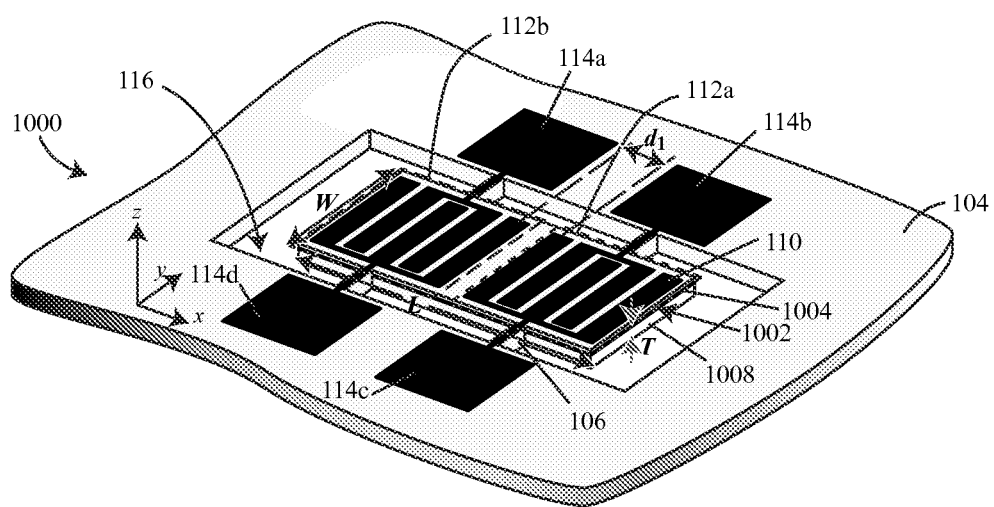
FIGS. 10A-10B illustrate perspective and cross-sectional views, respectively, of a variation on the device 100 of FIG. 1 including a floating conductive layer.
Figure 10B:
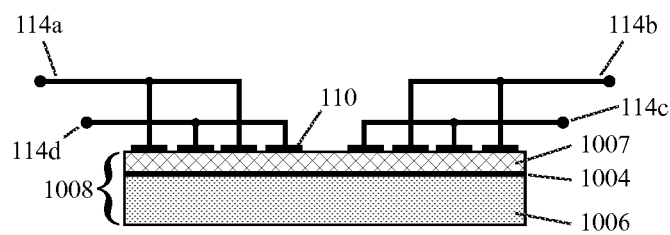

A multi-port device 1000 of FIG. 10A is similar to the device 500a of FIG. 5A, although the base 1008 of the mechanical resonating structure 1002 comprises multiple layers including a conductive plane 1004, which in this non-limiting example is a floating plane. A partial cross-section of the mechanical resonating structure 1002 taken along the length L is illustrated in FIG. 10B (the cross-section is partial in that not all of the electrodes 110 are shown). As shown, the floating conductive plane 1004 may separate a layer 1006 and a layer 1007. The layer 1006 may be a non-active layer, and may be formed of any suitable material, including but not limited to piezoelectric materials, dielectrics, substrate materials, and/or conductive materials. The layer 1007 may be an active layer of the resonating structure, and therefore may be formed of a piezoelectric material in some embodiments. However, other suitable materials may be used for layer 1007 depending on the type of resonating structure and the methods of actuation and/or detection of the resonating structure.

Figure 11A:
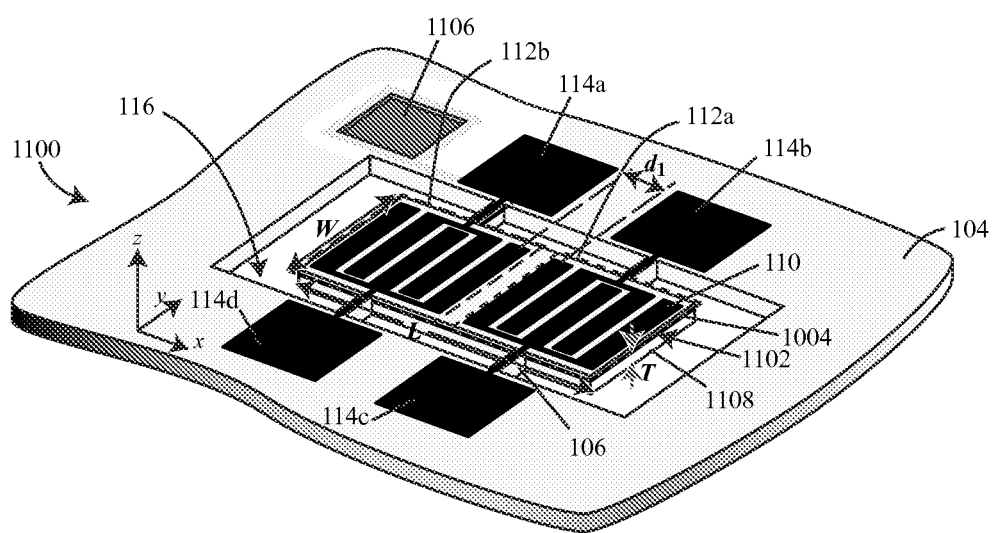
FIGS. 11A-11B illustrate perspective and cross-sectional views, respectively, of a variation on the device 100 of FIG. 1 including a grounded or biased conductive layer.
Figure 11B:
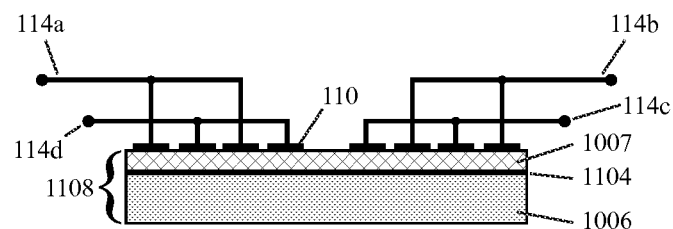

FIGS. 11A and 11B illustrate an alternative to device 1000 of FIGS. 10A and 10B, in which the multi-port device comprises a grounded conductive layer. As shown, the multi-port device 1100 is substantially similar to the device 1000 of FIG. 10A, except that the base 1108 of the mechanical resonating structure 1102 comprises a grounded conductive plane 1104. Accordingly, the multi-port device 1100 further comprises a ground pad 1106 for accessing the grounded conductive plane 1104. A partial cross-section of the mechanical resonating structure 1102 taken along the length L is illustrated in FIG. 11B (the cross-section is partial in that not all of the electrodes 110 are shown). While the conductive plane 1104 may be grounded, it may alternatively be biased by a suitable voltage, for example to facilitate tuning of the mechanical resonating structure or for any other purpose.

As mentioned, it may be desirable in some embodiments for a mechanical resonating structure to have temperature compensation functionality, for example to compensate for temperature-induced variations in the operation (e.g., resonance frequency behavior) of the mechanical resonating structure. Such temperature compensation functionality may be provided, in some non-limiting embodiments, by one or more structures of the mechanical resonating structure. Such structures may be layers of the mechanical resonating structure, or any other suitable structures. For example, one of more layers of a multi-layered base of a mechanical resonating structure may provide temperature compensation functionality.

As previously described, mechanical resonating structures according to one or more embodiments of the present invention may include an active layer formed of or comprising piezoelectric material (e.g., AlN). The piezoelectric material may soften (i.e., become less stiff) with increasing temperature over a temperature range of interest, such as the expected operating temperature range of the mechanical resonating structure. In other words, the piezoelectric material may exhibit a negative temperature coefficient of stiffness (TCS), which may impact the resonance frequency of the mechanical resonating structure. The temperature stability of a mechanical resonating structure may be quantified as the temperature coefficient of frequency (TCF), which is expressed as: TCF= (1/f) (∂f/∂T), where f is the resonance frequency and T is the temperature.

According to one aspect of the present invention, a mechanical resonating structure comprising four or more electrical ports may also comprise a temperature compensation structure configured to provide a suitable TCF over a temperature range of interest. The compensating structure that can be designed to have a stiffness variation with temperature such that it balances the stiffness variation with temperature of the active layer and/or any additional layers of the mechanical resonating structure (e.g., electrode layers, support layers, or any other layers of the mechanical resonating structure) to give the mechanical resonating structure a targeted stiffness variation over the temperature range. According to one aspect, the compensating structure can be designed such that the mechanical resonating structure has a desired frequency variation with temperature, for example by compensating for any one or more (including all) of the following: temperature-induced variations in stiffness of the materials of the mechanical resonating structure; temperature-induced expansion and/or contraction of materials; stresses caused by different coefficients of thermal expansion of different materials of the mechanical resonating structure; interfacial stresses arising from interfaces between materials of the mechanical resonating structure; stresses generated by a substrate and/or anchors connected to the mechanical resonating structure (in those embodiments in which the mechanical resonating structure is coupled to a substrate by anchors); and stresses arising from packaging of the mechanical resonating structure. For example, the compensating structure can be designed so that the resonance frequency of the mechanical resonating structure does not vary much, or at all, over a wide temperature range (e.g., TCF approaches, or is equal to 0).

Figure 12A:
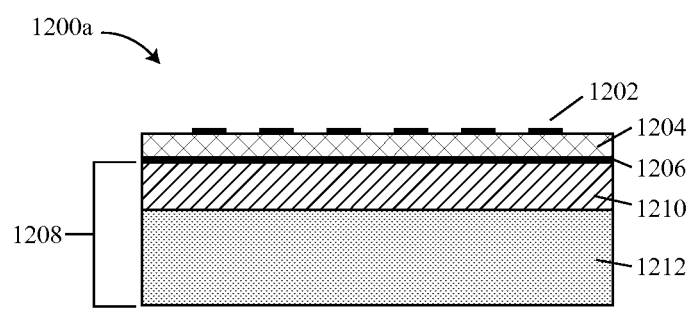
FIG. 12A shows a cross-sectional view of a mechanical resonating structure comprising a temperature compensation structure according to an embodiment of the present invention.

FIG. 12A illustrates an example of a mechanical resonating structure 1200a comprising a temperature compensation structure 1208. The mechanical resonating structure 1200a comprises an electrode layer 1202 which may be configured to connect to four or more electrical ports, an active layer 1204 (e.g., a piezoelectric material such as AlN), another electrode layer 1206 and the temperature compensation structure 1208, comprising a first layer 1210 and a second layer 1212. According to one embodiment, the compensation structure may be configured to provide the mechanical resonating structure with a TCF having an absolute value of less than approximately 1 ppm/K over a temperature range of at least 40° C. centered around room temperature (25° C.) for one or more modes of Lamb waves when the active layer is formed of aluminum nitride. However, this is merely a non-limiting example provided for purposes of illustration.

In the embodiment shown in FIG. 12A, the compensating structure includes a first layer 1210 and a second layer 1212. The stiffness of layers 1210 and 1212 may vary differently with temperature. For example, layer 1210 may have a stiffness that increases with increasing temperature over a temperature range (i.e., a positive TCS). Layer 1212 may have a stiffness that decreases, or stays relatively constant, with increasing temperature over a temperature range (i.e., a negative TCS). As described further below, the arrangement of the first and second layers (e.g., dimensions, location within the structure, etc.) may be selected to impart the mechanical resonating structures with desired behavior across a range of temperatures. For example, the arrangement may be selected so that the resonating structures have a relatively constant stiffness over a temperature range. That is, the TCS may approach or be equal to 0. This may contribute to minimizing the frequency variation over the temperature range (e.g., TCF may approach or be equal to 0). Thus, it should be appreciated that in some embodiments the temperature compensation structure may compensate for temperature-induced variations in stiffness of layers other than the active layer (but in addition to the active layer in some embodiments) of the mechanical resonating structure, e.g., one layer of the temperature compensation structure may compensate for temperature-induced stiffness variations of another layer of the temperature compensation structure. It should be understood that, in certain embodiments, the compensating structure may include one or more layers in addition to those shown in FIG. 12A. Some of these embodiments are described further below. The additional layer(s) may have the same composition as one of the first or second layers. In other embodiments, the additional layer(s) may have a different composition than both the first and second layers.

In some embodiments, the compensation structure may be formed of only a single layer (e.g., first layer 1210). In one such embodiment, for example, the active layer may be formed of silicon and the single layer of the compensation structure may be formed of $SiO_2$. In an alternative such embodiment, the active layer may be formed of aluminum nitride (AlN) and the single layer of the compensation structure may be formed of silicon dioxide ($SiO_2$). Other choices for the materials may also be used.

The first layer can have characteristics that are selected so that it has a positive TCS (i.e., TCS>0) over a temperature range. For example, the composition of the first layer may be selected to provide a positive TCS. Suitable compositions can include $SiO_2$ and $Al_2O_3$, amongst others. In some cases, $SiO_2$ may be preferred. In some cases, the first layer may be composed of a series of ultra-thin layers (e.g., less than 10 nm thick) which are combined to produce an overall layer having a positive TCS. The positive TCS may also, or alternatively, be engineered by implanting species (e.g., ions, neutrons) into the first layer. Thus, it should be understood that a layer exhibiting a positive TCS may be obtained in any of a number of suitable ways, and that the various aspects described herein including one or more layers exhibiting a positive TCS are not limited in the manner in which the positive TCS is obtained.

As noted above, first layer 1210 can have a positive TCS over a temperature range. In some cases, the TCS is positive across the entire operating temperature range of the device. For example, the TCS may be positive across the temperature range of between −55° C. and 150° C., or between −40° C. and 85° C. However, in other cases, the TCS of first layer 1210 may be positive across a portion of the operating range, and negative across other portion(s). The TCS of the first layer may be positive across the majority of the temperature range. In some embodiments, the TCS of the first layer may be positive across a range of at least 200° C.; in some embodiments, at least 100° C.; and, in other embodiments, at least 50° C.

As noted above, second layer 1212 may have a different stiffness-temperature dependence than the first layer. The second layer may be a support layer that provides robustness to the first layer. The second layer may be formed of a material having a lower acoustical loss than the material of the first layer. In some embodiments, the second layer is formed of a material having a certain crystal structure. For example, the second layer may be formed of a single crystal material and/or a material having higher crystal quality than the material of the first layer (e.g., lower defects). In particular, when the first layer comprises $SiO_2$, the robustness and support provided by the second layer is useful, since a structure comprised of a thin $SiO_2$ layer(s) and the active layer can be fragile and prone to damage if subjected to forceful mechanical movements or vibrations. The second layer can also provide improved signal performance (e.g., less noise and better Q-factor). The second layer may have a lower acoustic loss than the first layer. Suitable materials for second layer 1212 include silicon, diamond, silicon carbide, sapphire, quartz, germanium, aluminum nitride, and gallium arsenide, amongst others. In some embodiments, it is preferable for the second layer to be formed of silicon.

Figure 12B:
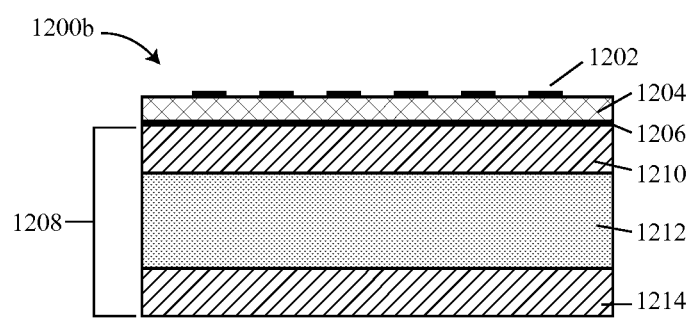
FIG. 12B shows a cross-sectional view of a mechanical resonating structure comprising a temperature compensation structure according to an embodiment of the present invention.

FIG. 12B illustrates another embodiment in which the compensating structure 1208 includes a third layer 1214. In some cases, the third layer may be formed of a material having a positive TCS. Suitable materials having a positive TCS were described above in connection with first layer 1210. In some embodiments, the third layer comprises the same material as first layer 1210. However, in other embodiments, the third layer may comprise a different material than the first layer (and the second layer). In some embodiments, layers 1210 and 1214 are formed of $SiO_2$ layers. In some of these cases, the second layer 1212 is formed of Si. As shown, the second layer is positioned between the first layer and the third layer. Other arrangements are possible.

In some embodiments, the third layer has a similar thickness as the first layer. For example, the ratio of the thickness of the third layer to the thickness of the first layer may be between 1:0.25 and 1:4.0, between 1:0.75 and 1:1.25, or about 1:1. For example, the listed ratios may be suitable when the third layer is formed of the same composition as the first layer (e.g., when the first and third layers are both formed of $SiO_2$, or any other suitable material (e.g., any other suitable positive TCS material)).

Figure 13A:
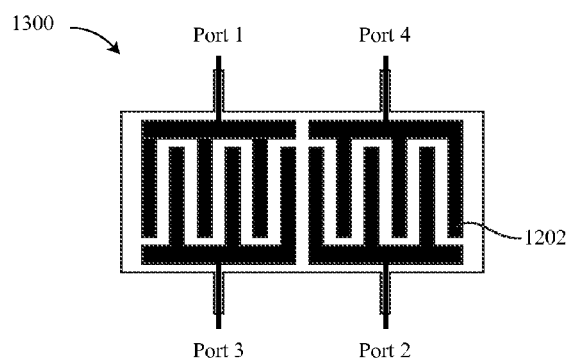
FIGS. 13A-13B illustrate a four-port mechanical resonating structure comprising a temperature compensation structure according to an embodiment of the present invention.
Figure 13B:
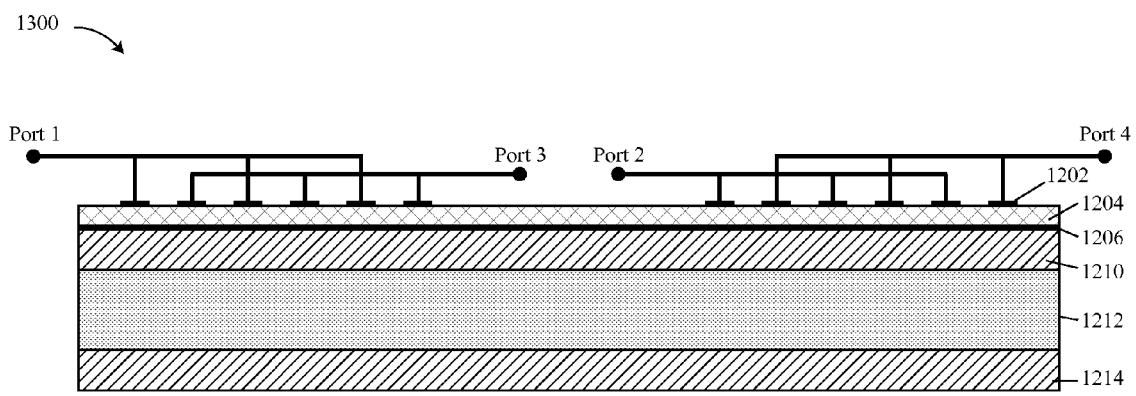

FIGS. 13A and 13B illustrate a non-limiting example of a mechanical resonating structure having four electrical ports (Port 1-Port 4) and a temperature compensation structure. FIG. 13A is a top view of the mechanical resonating structure 1300. FIG. 13B illustrates a cross-sectional view of the mechanical resonating structure 1300. The layers illustrated in FIG. 13B have been previously described with respect to FIG. 12B.

It should be appreciated that various configurations of temperature compensation structures for mechanical resonating structures may be designed according to aspects of the present invention, and that those illustrated in FIGS. 12-13 are non-limiting examples provided primarily for purposes of illustration.

In some embodiments, there may be a desired thickness ratio between layers in a mechanical resonating structure comprising a temperature compensation structure. In some cases, the thickness of the active layer (e.g., layer 1204) and the total thickness of the positive TCS material layer(s) (e.g., layer 1210 in FIG. 12A and layers 1210, 1214 in FIG. 12B) may be selected to provide a desired ratio. The ratio of the thickness of the active layer to the total thickness of the positive TCS material layer(s) may be between 1:1 and 1:500, or between 1:1 and 1:200 in some non-limiting embodiments. In some embodiments, the ratio may be between 1:1 and 1:10, or between 1:4 and 1:8, or between 1:5 and 1:7 (e.g., about 1:6). In some such embodiments, the active layer may be formed of aluminum nitride and the positive TCS material of the compensation structure may be formed of silicon dioxide, although other materials may be used for the active layer and positive TCS material layer, as those listed are merely examples. In embodiments which include more than one layer formed of a positive TCS material, the total thickness of the positive TCS material layer(s) includes the sum of the thickness of all such layers. In embodiments which include a single layer formed of a positive TCS material, the total thickness of the positive TCS material layer(s) is the thickness of that single layer. The above-noted ratios, for example, may be suitable when the positive TCS material in the layer(s) is $SiO_2$ and the active material is a piezoelectric material such as AlN. Other ratios may be suitable depending on the materials used.

In some cases, the thickness of the positive TCS material layer(s) and the thickness of the layer(s) having a lower acoustic loss than the positive TCS material layer(s) (e.g., layer 1212) are selected to provide a desired ratio. For example, the ratio of the total thickness of the positive TCS material layer(s) (e.g., the combined thickness of multiple positive TCS layers in those embodiments in which the compensation structure includes multiple positive TCS layers) and the layer(s) having a lower acoustic loss than the positive TCS material layer(s), may be between 1:0.1 and 1:10, 1:0.5 and 1:3, between 1:0.75 and 1:1.25, or between 1:1 and 1:2. The above-noted ratios may be suitable when, for example, the positive TCS material in the layer(s) is $SiO_2$ and the layer(s) having a lower acoustic loss than the positive TCS material layer(s) is/are formed of Si. These ratios may be suitable when the active material is a piezoelectric material such as AlN.

According to some embodiments, the ratio of the thickness of the active layer(s) of the mechanical resonating structure compared to the thickness of any layers of the temperature compensation structure having lower acoustic loss (e.g., layer 1212) may be designed to fall within certain ranges. For example, according to one embodiment the ratio of the thickness of the active layer to the total thickness of one or more layers of the temperature compensation structure having lower acoustic loss than the positive TCS layer(s) may be between 1:0.1 and 1:500, and in some embodiments may be between 1:0.5 and 1:20. Such ratios may be suitable when the active layer comprises, for example, AlN, and the layer of lower acoustic loss material comprises, for example, silicon. Other materials and other ratios may be used, however, as those listed are not limiting.

It should be appreciated that various aspects of the technology described herein are not limited to including or using four electrical ports. While some of the embodiments described and illustrated herein include four electrical ports, more than four electrical ports may also be included and used in some situations. Thus, the multi-port devices described herein are not limited in this respect.

For example, according to one embodiment, six electrical ports may be included. Three of the electrical ports may be input ports, receiving input signals, while three of the electrical ports may be output ports, providing output signals. For example, according to one non-limiting embodiment, a mechanical resonating structure may comprise three input electrical ports receiving a three-phase AC signal (i.e., each of the three input electrical ports may receive one of the three phases of the three-phase signal). The mechanical resonating structure may comprise three output electrical ports providing a three-phase output signal. Alternatively, the output signal may be any suitable combination of the three input phases. Thus, it should be appreciated that aspects of the technology described herein may be applied to mechanical resonating structures having any number of input and output electrical ports, and that some embodiments may include mechanical resonating structures comprising more than four electrical ports.

The multi-port devices described herein may be used as stand alone components, or may be incorporated into various types of larger devices. Thus, the various structures and methods described herein are not limited to being used in any particular environment or device. However, examples of devices which may incorporate one or more of the structures and/or methods described herein include, but are not limited to, tunable meters, mass sensors, gyroscopes, accelerometers, switches, and electromagnetic fuel sensors. According to some embodiments, the mechanical resonating structures described are integrated in a timing oscillator. Timing oscillators are used in devices including digital clocks, radios, computers, oscilloscopes, signal generators, and cell phones, for example to provide precise clock signals to facilitate synchronization of other processes, such as receiving, processing, and/or transmitting signals. In some embodiments, one or more of the multi-port devices described herein may form part or all of a MEMS.

Figure 14:
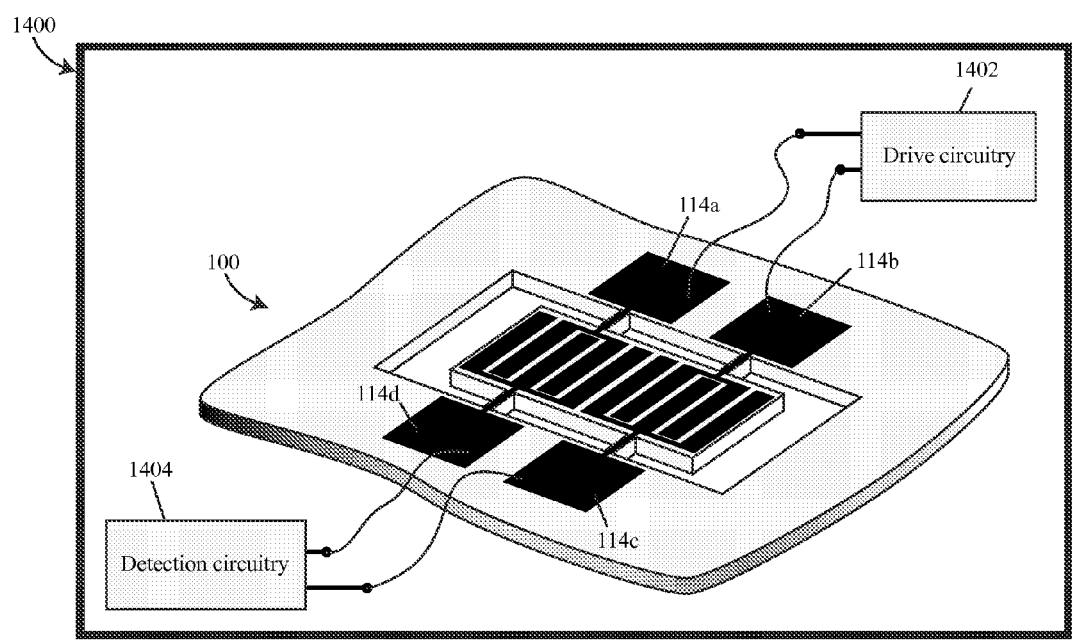
FIG. 14 illustrates the device 100 of FIG. 1 connected to drive and detection circuitry.

For example, FIG. 14 illustrates a non-limiting example of how the device 100 may be connected within a larger device, for example to form a timing oscillator. As shown, the device 1400 comprises the device 100 connected to drive circuitry 1402 and detection circuitry 1404. In the non-limiting embodiment, the electrical ports 114a and 114b are configured as input ports, being connected to the drive circuitry 1402. The connections may be formed by wires, wire traces, or any other suitable type of connections. The drive circuitry may provide a differential input signal to electrical ports 114a and 114b (i.e., one end to port 114a and the other end to port 114b), ground or bias signals to one or both ports, or any other suitable signals to the ports.

The electrical ports 114c and 114d are configured as output ports in the non-limiting example of FIG. 14, being connected to detection circuitry 1404. The connections may be made using wires, wire traces, or any other suitable type of connection. According to one embodiment, the detection circuitry receives a differential output signal provided by ports 114c and 114d, although the device 1400 is not limited in this respect. The detection circuitry 1404 may process the received output signals (e.g., by filtering, shaping, or otherwise), or may pass the output signals to further circuitry for processing, as the embodiment of FIG. 14 is not limited in this respect.

According to one embodiment, the device 100, drive circuitry 1402, and detection circuitry 1404 are contained within a single package. However, not all embodiments are limited in this respect, as an alternative embodiment has the drive circuitry 1402 and/or the detection circuitry 1404 located externally to a package containing the device 100. Other configurations are also possible. According to some embodiments, the device 100, drive circuitry 1402, and detection circuitry 1404 are formed on separate chips. However, not all embodiments are limited in this respect. In addition, it should be appreciated that the drive circuitry 1402 and detection circuitry 1404 may share one or more electrical components.

Thus, it should be appreciated that the structures and methods described herein may find application in various circuits and systems. For example, as explained, mechanical resonating structures as described herein may form at least part of a timing oscillator configured to output a timing signal. For example, the mechanical resonating structure may be coupled to drive circuitry and detection circuitry to form a timing oscillator.

According to another embodiment, mechanical resonating structures including one or more of the aspects described herein may be configured to form at least part of a filter, configured to receive and filter an input signal. According to one such embodiment, a mechanical resonating structure comprising four electrical ports may be configured to support Lamb waves, and may be configured as a filter having any of the following electrical configurations: (i) differential-to-differential; (ii) single-ended to differential; (iii) differential to single-ended; and (iv) single-ended to single-ended.

According to other embodiments, mechanical resonating structures according to one or more of the aspects described herein may be configured to form at least part of a gyroscope. In one such embodiment the mechanical resonating structure may not be configured to support Lamb waves.

One characteristic of mechanical resonating structures such as some of those described herein is the motional resistance of the structures. In some embodiments, it may be desirable to minimize the motional resistance of the resonating structure. In some embodiments, it may be desirable to provide an increased, or larger, motional resistance. Many of the multi-port mechanical resonating structures described herein have an increased motional resistance compared to conventional structures.

As mentioned previously, according to one aspect of the present invention, a mechanical resonating structure having four or more electrical ports may be tunable to provide an output signal having a frequency of interest. The tuning techniques described herein may be implemented with any of the excitation configurations previously described (i.e., (a) differential-to-differential operation; (b) single-ended-to-single-ended operation; (c) single-ended-to-differential operation; or (d) differential-to-single-ended operation), or with any other suitable excitation configurations.

According to one embodiment, a mechanical resonating structure having four or more electrical ports is coupled to a phase shifter configured to shift the phase of the output signal(s) and/or input signal(s) of the mechanical resonating structure. The phase shifter may be configured in a feedback loop with the mechanical resonating structure in some non-limiting embodiments. According to an alternative embodiment, a tuning subcircuit formed of inductors and/or capacitors is coupled to a mechanical resonating structure to provide tuning functionality. At least some of the devices may offer greater tuning flexibility and capability than that of conventional electromechanical oscillators, for example in that they may be tuned to exhibit resonant behavior below and above the series resonance frequency of the mechanical resonating structure.

According to one aspect of the technology described herein, an electromechanical device (e.g., a timing oscillator, a filter, a sensor, or other type of device) has a mechanical resonating structure that has a series resonance frequency, and the device is configured to allow for tuning of the device's frequency of operation on both sides of the series resonance frequency of the mechanical resonating structure. Thus, devices having mechanical resonating structures may be tuned to exhibit resonant behavior at a desired frequency even though the inherent resonance frequency of the mechanical resonating structure may not be equal to the desired resonance frequency, either because of manufacturing errors, temperature variations, or for any other reason (e.g., ambient pressure variations, package-induced stresses, or material-dependent stresses, among others). As a result, the need for strict manufacturing tolerances of the mechanical resonating structure may be relaxed, since the device may be accurately tuned to compensate for any deviations of the inherent resonance frequency of the mechanical resonating structure from the desired resonance frequency.

According to one embodiment, a device having a mechanical resonating structure with four or more electrical ports includes a phase shifter configured to shift the phase of the input signal(s) to and/or output signal(s) from the mechanical resonating structure. In some embodiments the mechanical resonating structure is configured in a feedback loop, and inducing a phase difference between the input signal(s) and output signal(s) of the mechanical resonating structure operating at a first frequency may cause the mechanical resonating structure to shift its operation to a second frequency. Thus, in some such embodiments, introducing a suitable phase difference between the input and output signal(s) of the mechanical resonating structure may allow for tuning the mechanical resonating structure to vibrate at a desired frequency.

The phase-shifting technique described may be implemented at any suitable location, or stage, within a device comprising the mechanical resonating structure. According to one embodiment, a phase shifter is coupled in a feedback loop with the mechanical resonating structure and is therefore configured to control a phase difference between the input signal to the mechanical resonating structure and an output signal of the mechanical resonating structure. The phase shifter receives the output signal of the mechanical resonating structure, induces a phase shift in the output signal, and then provides the phase shifted signal back to the mechanical resonating structure as an input signal. By suitably selecting the amount of phase shift induced, which may be variable in some embodiments, the device may be operated to exhibit resonant behavior at a desired resonance frequency, which frequency may differ from the inherent resonance frequency of the mechanical resonating structure.

Figure 15:
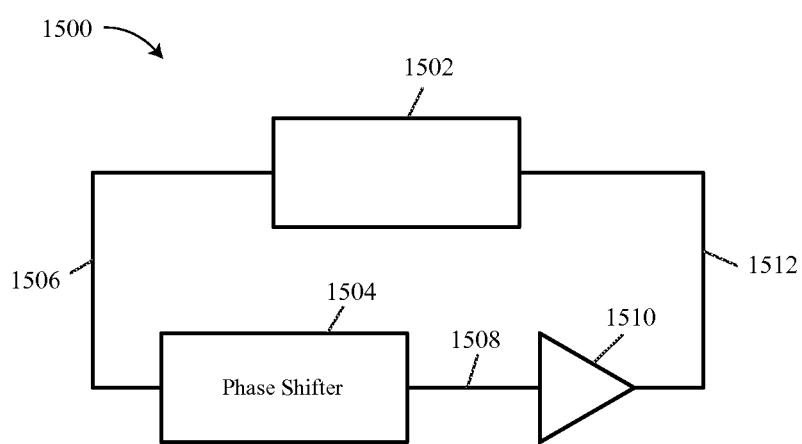
FIG. 15 illustrates a feedback loop comprising a mechanical resonating structure and a phase shifter according to one embodiment of the present invention.

FIG. 15 illustrates one non-limiting example of a device (which, in some embodiments, may be an oscillator) comprising a mechanical resonating structure and a phase shifter configured in a feedback loop. As will be illustrated below, the device may allow for tuning of the resonance frequency of the device on either side of the series resonance frequency of the mechanical resonating structure (i.e., above and below the series resonance frequency).

The device 1500 comprises a mechanical resonating structure 1502 and a phase shifter 1504, configured in a feedback loop. The mechanical resonating structure 1502 may be any of the mechanical resonating structures described herein. The phase shifter 1504 may be any suitable type of phase shifter for receiving an input signal and producing an output signal having a phase shifted relative to that of the input signal. It should be appreciated that phase shifter 1504 may be a variable phase shifter according to some embodiments, such that the amount of phase shift provided by the phase shifter 1504 may be varied. Also, it should be appreciated that the circuit of FIG. 15 is not limited to operating on any particular types of signals (single-ended, differential, etc.) of a multi-port mechanical resonating device.

With respect to FIG. 15, the mechanical resonating structure 1502 may produce an output signal 1506 which may be input to the phase shifter 1504. The phase shifter 1504, upon receiving the output signal 1506 of the mechanical resonating structure 1502, may shift the phase of the output signal 1506 and produce a phase-shifted output signal 1508. The phase-shifted output signal 1508 may be identical to the resonating structure output signal 1506, except for having a different phase. However, the various aspects described herein are not limited in this respect.

According to some embodiments, a gain factor is applied in the feedback loop of device 1500. In the non-limiting example of FIG. 15, an amplifier 1510 is included to provide gain, and may have any suitable gain factor. The amplifier 1510 receives the phase-shifted output signal 1508, and produces an amplified output signal 1512, which is then provided to an input of the mechanical resonating structure 1502. Thus, in some embodiments, the signal provided to the input of the mechanical resonating structure 1502 may differ from the output of the mechanical resonating structure in both phase and magnitude, although not all embodiments are limited in this respect.

It should be appreciated that the inclusion and configuration of amplifier 1510 for providing gain is subject to variation, and may not be included in all embodiments. For example, a gain stage could alternatively be provided in front of the phase shifter 1504 (as opposed to behind the phase shifter 1504), to operate directly on the output signal of the mechanical resonating structure 1502. Alternatively, a gain stage may be implemented as part of the phase shifter 1504, rather than as a distinct element. Other configurations are also possible, and the various aspects described herein are not limited to using any particular type or configuration of gain element.

In operation, if the total amount of phase shift provided by the phase shifter 1504 is greater than, for example, 180 degrees, the device 1500 may exhibit resonance at a frequency greater than the series resonance frequency of the mechanical resonating structure 1502. If the total amount of phase shift provided by the phase shifter 1504 is less than, for example, 180 degrees, the device 1500 may exhibit resonance at a frequency lower than the series resonance frequency of the mechanical resonating structure 1502. Thus, by varying the amount of phase shift provided by the phase shifter 1504, the device 1500 may be tuned on both sides of the series resonance peak of the mechanical resonating structure 1502, as illustrated in FIG. 16.

Figure 16:
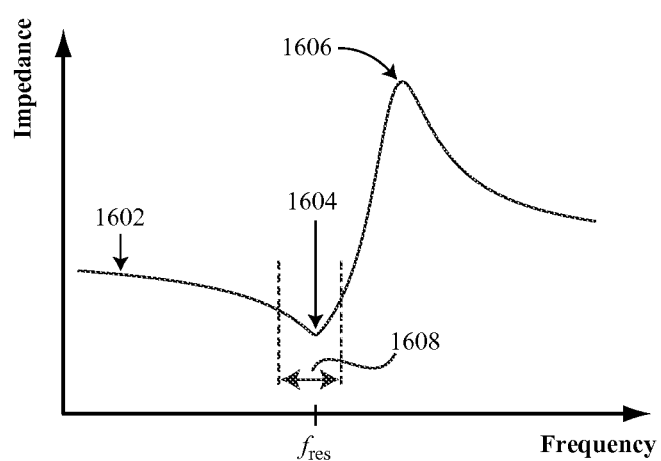
FIG. 16 shows an impedance curve for a resonator, and illustrates that tuning methods according to aspects of the invention described herein allow for tuning on both sides of the series resonance peak.

FIG. 16 illustrates an impedance curve 1602 for a resonating structure. The impedance curve 1602 includes a series resonance peak 1604, occurring at a resonance frequency of the resonating structure, labeled as $f_{res}$, as well as a parallel resonance peak 1606. The circuit and operation described above in connection with FIG. 15 allow for tuning of a device resonance frequency on both sides of the series resonance peak 1604 (i.e., at frequencies greater than or less than the series resonance frequency), as illustrated by the tuning range

1608. Thus, flexibility and accuracy in the tuning of a device, such as device 1500, may be increased compared to conventional oscillators having mechanical resonating structures.

It should be appreciated that the amount of phase shift provided by phase shifter 1504 may be varied, for example in those embodiments in which phase shifter 1504 is a variable phase shifter. The amount of phase shift may be varied to compensate for variations in the inherent resonance frequency of the mechanical resonating structure 1502 during operation, for example including temperature-induced variations, material-stress dependent variations, ambient pressure variations, packaging-induced stress variations, or any other types of variations. For example, a calibration routine may be performed to calibrate the amount of phase shift which phase shifter 1504 should provide to compensate for a given change in temperature. Similarly, a calibration routine may be performed to calibrate the amount of phase shift provided by phase shifter 1504 to the resulting change in resonance frequency of the device 1500. However, it should be appreciated that other methods for determining the amount of phase shift provided by phase shifter 1504 may also be used, as the various aspects described herein are not limited in this respect.

It should be appreciated that various modifications and alterations of the device 1500 in FIG. 15 may be made while still providing the ability to tune the device 1500 on both sides of the series resonance peak of the mechanical resonating structure 1502. For example, according to one embodiment, the phase shifter 1504 may perform a coarse phase adjustment and a fine phase adjustment of the resonating structure output signal 1506, in which the coarse phase adjustment is larger than the fine phase adjustment. For example, in some embodiments, the amount of phase shift induced by the coarse phase adjustment may be 50 degrees or more, 90 degrees or more, 120 degrees or more, approximately 180 degrees, between approximately 90-270 degrees, between approximately 120-360 degrees, or any other suitable amount, as the various aspects described herein as implementing a coarse phase adjustment are not limited to providing any particular amount of coarse phase adjustment. The amount of phase shift induced by the fine phase adjustment may be less than that provided by the coarse phase adjustment, and may be, for example, less than approximately 5 degrees, less than approximately 10 degrees, less than approximately 20 degrees, less than approximately 1 degree, between approximately 1-10 degrees, or may be any other suitable amount, as the various aspects described herein as implementing a fine phase adjustment are not limited to providing any particular amount of fine phase adjustment. The coarse and/or fine phase adjustment may be provided in increments of 1 degree, 5 degrees, 10 degrees, a fraction of a degree, or in any other suitable increments, as the various aspects described herein are not limited in this respect.

Figure 17A:
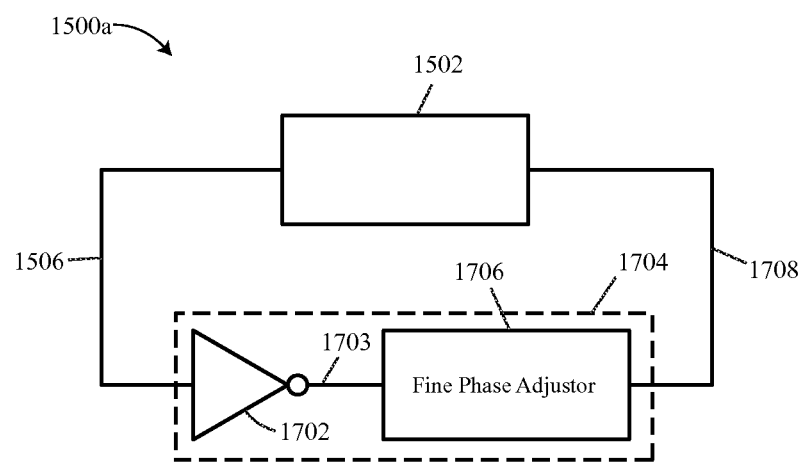
FIGS. 17A-17B illustrate alternative implementations of an electromechanical circuit having a mechanical resonating structure and a phase shifter, in which the phase shifter includes a coarse phase adjustor and a fine phase adjustor, according to alternative embodiments of the invention.

Device 1500a, which is a variation of the device 1500, is shown in FIG. 17A, and comprises a phase shifter 1704 having an inverting amplifier 1702 and a fine phase adjustor 1706. The inverting amplifier 1702 may function as a coarse phase adjustor, for example receiving the output signal 1506 of the mechanical resonating structure 1502 and providing an inverted version 1703 of that signal, therefore having a phase shift of approximately 180 degrees from the phase of the output signal 1506 of the resonating structure 1502. The output signal 1703 of the inverting amplifier 1702 may then be provided to the fine phase adjustor 1706, which may further adjust the phase by an additional amount, for example by one degree, five degrees, ten degrees, fifteen degrees, a fraction of a degree, or any other suitable amount, to produce the phase-shifted signal 1708, which may be provided to an input of the mechanical resonating structure 1502.

It should be appreciated that the device 1500a does not include the amplifier 1510, since the inverting amplifier 1702 may provide gain within the feedback loop. However, not all embodiments are limited in this respect, as any number of gain elements may be included in the feedback loop of a device having a mechanical resonating structure and a phase shifter.

Figure 17B:
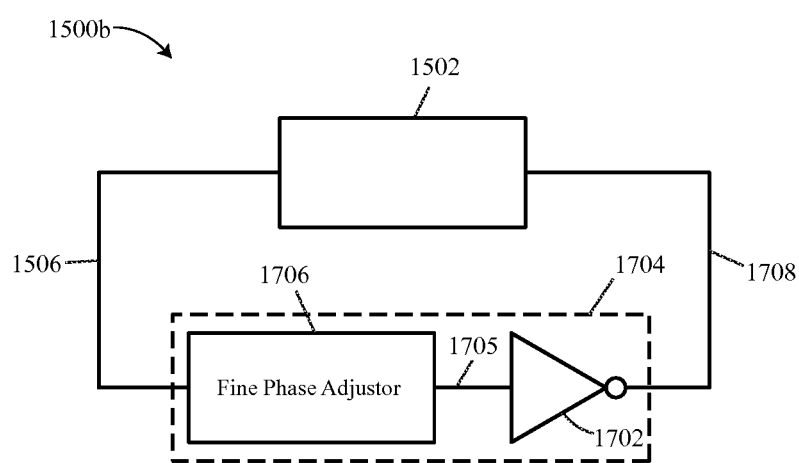

It should further be appreciated that the order in which the coarse phase adjustment and the fine phase adjustment are performed in device 1500a is not limiting. For example, FIG. 17A illustrates that the coarse phase adjustment, i.e., the 180 degree phase adjustment provided by inverting amplifier 1702, occurs prior to the fine phase adjustment provided by the fine phase adjustor 1706. However, as shown in FIG. 17B, the order of the inverting amplifier 1702 and the fine phase adjustor 1706 may be reversed in a device 1500b, such that the fine phase adjustment is performed on the output signal 1506 of the resonating structure 1502, with the fine phase-adjusted output signal 1705 of the fine phase adjustor being provided to the inverting amplifier 1702. The output signal of the inverting amplifier, which may therefore correspond to the phase-shifted signal 1708, may then be provided to an input of the mechanical resonating structure 1502.

According to another embodiment, an electromechanical device (e.g., an oscillator, a filter, a sensor, or any other suitable device) comprises a mechanical resonating structure, an electronic drive circuit, and an LC tuning subcircuit. The LC tuning subcircuit may comprise an inductor and a capacitor, one or both of which may be variable, and may facilitate tuning of the device resonance frequency on both sides of the series resonance frequency of the mechanical resonating structure.

Figure 18:
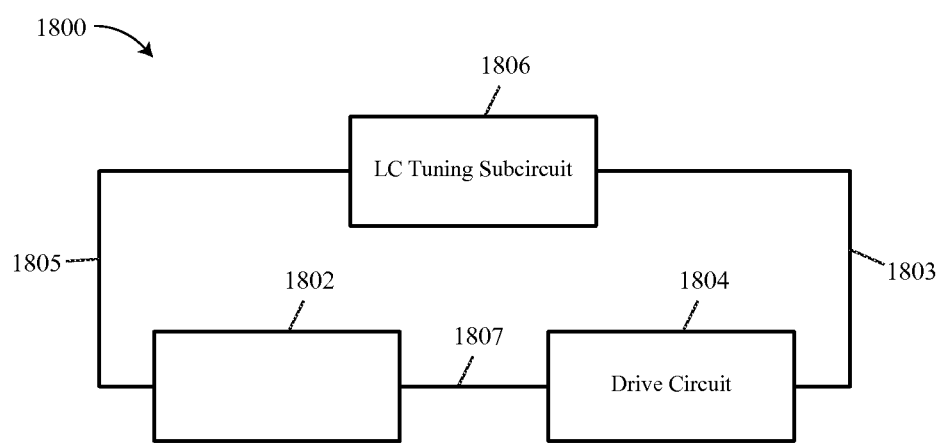
FIG. 18 is a schematic diagram of a device comprising a mechanical resonating structure, a drive circuit, and an LC tuning subcircuit, according to one embodiment of the invention.

FIG. 18 illustrates one non-limiting example of an electromechanical device 1800 comprising a mechanical resonating structure 1802 coupled to a drive circuit 1804. The drive circuit 1804 provides a drive signal 1803 (e.g., an oscillating drive signal (e.g., an AC signal), or any other suitable drive signal) to an LC tuning subcircuit 1806, which then provides an output signal 1805 to the mechanical resonating structure 1802. The output signal 1807 of the mechanical resonating structure is then provided to an input of the drive circuit 1804.

According to some embodiments, the LC tuning subcircuit 1806 may be variable, such that the reactance of that subcircuit may be varied to adjust the resonance frequency of the device 1800. The LC tuning subcircuit may therefore take any suitable form, one non-limiting example of which is described below in connection with FIG. 19.

The mechanical resonating structure 1802 may be any type of mechanical resonating structure, such as any of the types described herein. In some embodiments, micromechanical resonating structures may be preferred. For example, micromechanical resonating structures may have a large dimension (e.g., the largest of length, width, or thickness) of less than 100 microns, or may have any other suitable dimension(s). The drive circuit 1804 may be any suitable drive circuit for driving the resonating structure 1802, for example at or near the series resonance frequency of the mechanical resonating structure 1802.

Figure 19:
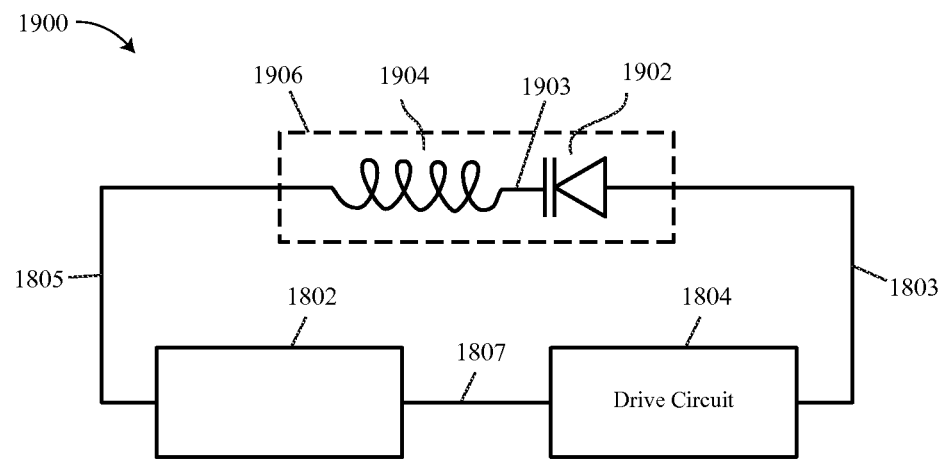
FIG. 19 illustrates one example of an implementation of the device of FIG. 18, in which the LC tuning subcircuit includes a variable capacitor.

FIG. 19 illustrates one non-limiting implementation of a device having a mechanical resonating structure and an LC tuning subcircuit (such as device 1800 of FIG. 18), in which the LC tuning subcircuit includes a variable capacitor and a fixed value inductor. As shown, the device 1900 comprises the drive circuit 1804, an LC tuning subcircuit 1906, and the mechanical resonating structure 1802. In this non-limiting embodiment, the LC tuning subcircuit 1906 comprises a variable capacitor 1902, which receives the drive signal 1803 from the drive circuit 1804 and produces an output signal 1903. The LC tuning subcircuit further comprises an inductor 1904, which in the non-limiting example of FIG. 19 is a fixed value inductor. The inductor 1904 receives the output signal 1903 from the variable capacitor 1902 and produces the output signal 1805, which is provided to the mechanical resonating structure.

In some embodiments of electromechanical devices employing an LC tuning subcircuit (e.g., LC tuning subcircuit 1906), any inductors and/or capacitors of the LC tuning subcircuit are distinct from any parasitic inductance and parasitic capacitance of the mechanical resonating structure of the electromechanical device. In some embodiments, any inductors and/or capacitors of the LC tuning subcircuit have larger values than any parasitic inductances and/or capacitances of the mechanical resonating structure. For example, in some embodiments, the inductance of an inductor of an LC tuning subcircuit is approximately twice as great as any parasitic inductance of the mechanical resonating structure, is approximately 1.5-3 times as great, is approximately five times or more (e.g., ten times, 15 times, or any other suitable amount) greater than any parasitic inductance of the mechanical resonating structure, or has any other suitable value. Similarly, in some embodiments, the capacitance of a capacitor of an LC tuning subcircuit is approximately twice as great as any parasitic capacitance of the mechanical resonating structure, is approximately 1.5-3 times as great, is approximately five times or more (e.g., ten times, 15 times, or any other suitable amount) greater than any parasitic capacitance of the mechanical resonating structure, or has any other suitable value.

In operation, the capacitance of the variable capacitor 1902 may be varied to adjust a total impedance value of the device 1900, for example to minimize the total impedance of the device 1900 to achieve resonant behavior. The variable capacitor 1902 may be any suitable type of variable capacitor, and therefore its capacitance value may be varied in any suitable manner.

The variable capacitor 1902 and the inductor 1904 may have any suitable values. For example, according to one non-limiting embodiment, the inductance value of the inductor 1904 may be selected such that the reactance of the inductor 1904 at a particular frequency is midway between the lower and upper reactances of the variable capacitor at that frequency. As an example, the variable capacitor may have a capacitance which may be varied between 10 and 20 picoFarads, as just one non-limiting example, such that the reactance of the variable capacitor may be varied between an upper reactance value (i.e., when the capacitance is 10 picoFarad) and a lower reactance value (i.e., when the capacitance has a value of 20 picoFarads). The inductance value of inductor 1904 may be chosen, for example by suitable design, so that the reactance of the inductor is approximately equal to the midpoint between the lower and upper reactance values of the variable capacitor. It should be appreciated that the actual values of the inductor and capacitor may be chosen appropriately for a desired application, and that the examples given above (i.e., 10 picoFarads) are merely non-limiting examples for purposes of illustration.

The variable capacitor 1902 and the inductor 1904 may take any suitable form. For example, they may be implemented as discrete electrical components, may be integrated with other components of the device (e.g., as transmission lines, or otherwise), or may be formed in any other suitable manner, as the various aspects described herein are not limited in this respect.

It should further be appreciated that various alterations on the devices 1800 and 1900 are possible. For example, according to one embodiment, a device comprises an LC tuning subcircuit (e.g., LC tuning subcircuit 1806) having a variable inductor and a fixed value capacitor. Alternatively, according to another embodiment, a device comprises an LC tuning subcircuit (e.g., LC tuning subcircuit 1806) having both a variable inductor and a variable capacitor.

In any of the scenarios discussed, suitable adjustment of the relative values of an inductor and capacitor of an LC tuning subcircuit may allow for tuning of the device comprising the LC subcircuit on both sides of the series resonance frequency of the mechanical resonating structure of the device, as shown and described previously in connection with FIG. 16.

Figure 20:
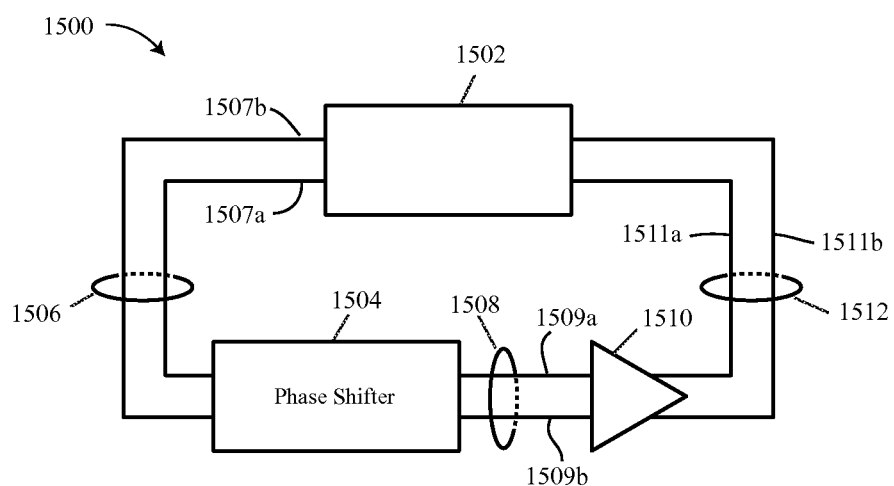
FIG. 20 illustrates the feedback loop of FIG. 15 in connection with multi-ended signals, according to one embodiment.

It should be appreciated from the foregoing that the various techniques and circuits described herein may be applied to and work with any types of signals. For example, the signals may be single-ended signals, differential signals, three-phase signals, or any other suitable types of signals, and thus may operate with any of the multi-port resonating structures described herein. FIG. 20 illustrates a non-limiting example.

As shown in FIG. 20, the device 1500 of FIG. 15 may operate on differential signals (i.e., signals having equal and opposite magnitude) or modified differential signals (i.e., signals having two ends, which may not be equal and opposite in magnitude). Thus, the output signal 1506 of the mechanical resonating structure may include two ends, 1507a and 1507b, where the "ends" of the output signal 1506 are the two distinct signals making up the output signal. The output signal 1506 may be a differential signal, with the two ends 1507a and 1507b being equal and opposite in magnitude. However, the embodiment of FIG. 20 is not limited in this respect. Similarly, the phase-shifted output signal 1508 may include two ends, 1509a and 1509b. The end 1509a may correspond to the end 1507a of output signal 1506. Likewise, the end 1509b may correspond to the end 1507b of output signal 1506. The amplifier 1510 may receive the two ends, 1509a and 1509b, of phase-shifted output signal 1508, and produce the amplified output signal 1512. The amplified output signal 1512 may include two ends, 1511a and 1511b, corresponding to ends 1509a and 1509b, respectively.

Again, it should be appreciated that the other techniques and circuits described in this application (e.g., other than the device 1500) may also implement signals having multiple (two or more) ends, and that the various aspects of the technology are not limited in this respect.

According to one aspect of the technology, a mechanical resonating structure provides an output signal having multiple ends (e.g., a differential output signal), the phases of which are then shifted by equal amounts. According to another aspect of the technology, a mechanical resonating structure provides an output signal having multiple ends, the phases of two or more of which are then shifted by differing amounts. For example, referring to FIG. 20, the phase of end 1507a may be shifted by phase shifter 1504 by a different amount than that by which the phase of end 1507b is shifted. As a result, the phase-shifted output signal 1508 may include ends 1509a and 1509b having different phases from each other. The ends 1511a and 1511b of the amplified output signal 1512 may therefore also have different phases from each other, such that they are fed back into the resonating structure 1502 as an input signal having ends with different phases from each other.

The above-described technique of shifting the phases of the ends of a mechanical resonating structure output signal by differing amounts and then providing an input signal to the mechanical resonating structure, with the input signal including two or more ends having differing phases, may be performed for any reason. According to some embodiments, such a technique may be used to provide a constant (or approximately constant) input power to the resonating structure 1502. For example, by shifting the phases of the ends of a resonating structure input signal relative to each other, a constant power of the input signal may be achieved, facilitating efficient operation of the resonating structure, for example if the input power is maintained approximately constant at a value equal to (or approximately equal to) the maximum input power which the resonator may tolerate.

According to those embodiments in which a mechanical resonating structure output signal has multiple ends and two or more of those ends have their phases shifted by different amounts, the difference in amount of phase shift may take any suitable value(s), and may be static or variable. For example, referring to FIG. 20, the phase of end 1507a may be shifted by a first amount to produce end 1509a and the phase of end 1507b may be shifted by a second amount to produce end 1509b (or one may be shifted and the other not shifted). In some embodiments, the first amount and second amount may differ from each other by between approximately 0 and 20 degrees. In some embodiments, the first amount and second amount may differ from each by between approximately 0 and 10 degrees (e.g., 1 degree, 2 degrees, 5 degrees, etc.). In some embodiments, the first amount and second amount may differ from each by between 10 and 20 degrees (e.g., 15 degrees). Other ranges and other values for the difference in phase shift may be employed, as the aspects described herein relating to shifting the ends of a mechanical resonating structure output signal by differing amounts are not limited to using any particular differing amount. In addition, as mentioned, the amount of difference may be changed over time.

In addition, it should be appreciated that the above-described techniques for shifting the ends of a mechanical resonating structure output signal by differing amounts may apply to any number of ends of a mechanical resonating structure output signal. For example, if the mechanical resonating structure outputs a 3-phase signal, two or more of the ends may have their phases shifted by different amounts, and then provided to the mechanical resonating structure as an input signal. Thus, the techniques described are not limited to use with any particular types of signals (e.g., single-ended signals, differential signals, modified differential signals, 3-phase signals, etc.).

Moreover, in addition to shifting the phase(s) of signals of the mechanical resonating structure, the amplitude may be shifted. For example, according to one embodiment, two ends of a differential output signal of a mechanical resonating structure may be phase shifted relative to each other (i.e., so there is a phase difference between the two ends) and the amplitudes of the two ends may be different (e.g., by applying different gains to the ends). The two ends may then be fed back to the mechanical resonating structure as input signals. The difference in amplitudes of the two ends may further contribute to a resulting phase shift of the input signal to the mechanical resonating structure comprising the two ends. Thus, the amplitude of the signals may be controlled to further facilitate tuning of the mechanical resonating structure.

As mentioned, one or more of the apparatus and techniques described above may provide accuracy and flexibility in tuning of a device. For example, according to some embodiments, the tuning range of a device (e.g., tuning range 1608) may be approximately 700 parts-per-million (ppm) of the resonance frequency of the device, may be at least 300 ppm of the resonance frequency, may be at least 400 ppm of the resonance frequency, may be at least 500 ppm of the resonance frequency, may range from 300-800 ppm of the resonance frequency (e.g., between approximately 400 and 600 ppm, between approximately 500 and 700 ppm, between approximately 600-800 ppm), or may have other values. Also, as mentioned, the ability to adjust the resonance frequency of a device on both sides of a series resonance frequency of a mechanical resonating structure may relax design constraints on the mechanical resonating structure, since any deviation of the inherent resonance frequency of the mechanical resonating structure from a desired value may be compensated for by suitable tuning. Similarly, temperature-induced variations in the resonance frequency of the mechanical resonating structure may be compensated for using one or more of the techniques described above.

According to some embodiments, the tuning methods described herein may be used in combination with other tuning methods, including but not limited to stress tuning, either by electrostatic techniques or piezoelectric techniques. Other types of tuning are also possible, as the tuning techniques described herein are not limited to being used as the sole type of tuning of a device.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

In addition, while some references have been incorporated herein by reference, it should be appreciated that the present application controls to the extent the incorporated references are contrary to what is described herein.

What is claimed is:

1. A device comprising:
   a suspended mechanical resonating structure having a first surface and a second surface opposite the first surface;
   a substrate coupled to the suspended mechanical resonating structure such that ends of the suspended mechanical resonating structure are free;
   four electrical ports; and
   four electrodes formed on the first surface, each one of the four electrodes being coupled to a respective one of the four electrical ports,
   wherein the four electrical ports include two input ports configured as a differential input port and two output ports configured as a differential output port, and
   wherein the mechanical resonating structure is formed of multiple layers, the layers comprising:
      a first temperature compensating layer;
      a second temperature compensating layer;
      a conductive layer forming a conductive plane, wherein the conductive layer contacts the second temperature compensating layer; and
      an active layer comprising a piezoelectric material, wherein the active layer contacts the conductive layer,
      wherein the first and second temperature compensating layers compensate for temperature induced changes in a resonance frequency of the mechanical resonating structure,
      wherein at least one of the first and second temperature compensating layers comprises Silicon Dioxide, and wherein the piezoelectric material is Aluminum Nitride or Silicon.

2. The device of claim 1, wherein
the substrate is coupled to sides of the suspended mechanical resonating structure via a plurality of anchors such that the anchors are substantially parallel to the ends of the suspended mechanical resonating structure.

3. The device of claim 2, wherein a first electrode and second electrode of the four electrodes are configured to form at least part of a first transducer, and wherein a third electrode and fourth electrode of the four electrodes are configured to form at least part of a second transducer.

4. The device of claim 3, wherein the first electrode is proximate the third electrode, and wherein the first and third electrodes are separated by a distance approximately equal to a multiple of $\lambda/2$, wherein $\lambda$ is a wavelength of a Lamb wave supported by the mechanical resonating structure, and wherein the distance is measured from an approximate center of each of the first and third electrodes.

5. The device of claim 3, wherein the first electrode is proximate the third electrode, and wherein the first and third electrodes are separated by a distance approximately equal to a multiple of $\lambda 4$, wherein $\lambda$ is a wavelength of a Lamb wave supported by the mechanical resonating structure, and wherein the distance is measured from an approximate center of each of the first and third electrodes.

6. The device of claim 2, wherein the mechanical resonating structure has a substantially rectangular shape.

7. The device of claim 6, wherein the mechanical resonating structure has beveled edges.

8. The device of claim 2, wherein the mechanical resonating structure is substantially ring-shaped.

9. The device of claim 2, wherein the mechanical resonating structure is substantially disc-shaped.

10. The device of claim 2, wherein the mechanical resonating structure is substantially planar and is configured to support Lamb waves.

11. The device of claim 10, wherein the mechanical resonating structure has a thickness value less than approximately two wavelengths of a resonant wave of the mechanical resonating structure.

12. The device of claim 11, wherein the thickness value is less than approximately one wavelength of a resonant Lamb wave of the mechanical resonating structure.

13. The device of claim 1, wherein the conductive layer is electrically grounded.

14. The device of claim 1, wherein the conductive layer is electrically biased.

15. The device of claim 1, wherein the conductive layer is electrically floating.

16. The device of claim 1, wherein:
the mechanical resonating structure has a thickness less than approximately three wavelengths of a resonance frequency of the mechanical resonating structure;
the four electrodes are disposed on the first surface of the mechanical resonating structure;
two of the four electrodes are configured to receive a differential input signal; two of the four electrodes are configured to provide a differential output signal;
a first electrode of the two electrodes configured to receive a differential input signal is proximate to a second electrode of the two electrodes configured to receive a differential input signal;
a third electrode of the two electrodes configured to provide a differential output signal is proximate to a fourth electrode of the two electrodes configured to provide a differential output signal; and
the first and third electrodes are separated by a distance approximately equal to a multiple of $\lambda/2$, wherein $\lambda$ is a wavelength of a Lamb wave supported by the mechanical resonating structure, and wherein the distance is measured from an approximate center of each of the first and third electrodes.

17. The device of claim 16, wherein the thickness of the mechanical resonating structure is less than approximately one wavelength of the resonance frequency of the mechanical resonating structure.

18. The device of claim 1, wherein
the mechanical resonating structure is substantially planar, the first surface is substantially planar, and the four electrodes are disposed on the first surface of the substantially planar suspended mechanical resonating structure;
and further comprising
a plurality of anchors coupling the mechanical resonating structure to the substrate,
wherein the plurality of anchors contact sides of the mechanical resonating structure and one or more of the anchors are substantially parallel to the ends of the mechanical resonating structure.

19. The device of claim 18, wherein the device is configured to form at least part of a timing oscillator configured to generate a timing output signal.

20. The device of claim 18, wherein the device is configured to form at least part of a filter.

21. The device of claim 18, wherein the device is configured to form at least part of a gyroscope.

22. The device of claim 1, wherein the second temperature compensating layer has a stiffness that increases with increases in temperature and the first temperature compensating layer has a stiffness that decreases with increases in temperature.

23. The device of claim 2, wherein the suspended mechanical resonating structure comprises a base on which the four electrodes are formed, wherein the base has a first end having a first width and a second end having the first width, and wherein the base comprises a neck region having a smaller width than the first width.

24. The device of claim 1, wherein the first temperature compensating layer has a lower acoustic loss than the second temperature compensating layer.

* * * * *